US010412329B2

(12) United States Patent
Sakano et al.

(10) Patent No.: US 10,412,329 B2
(45) Date of Patent: Sep. 10, 2019

(54) IMAGING APPARATUS WITH LOGARITHMIC CHARACTERISTICS AND METHOD FOR DRIVING THE SAME

(71) Applicant: SONY SEMICONDUCTOR SOLUTIONS CORPORATION, Kanagawa (JP)

(72) Inventors: Yorito Sakano, Kanagawa (JP); Tsutomu Imoto, Kanagawa (JP); Hideo Nomura, Kanagawa (JP); Yoshiaki Tashiro, Kanagawa (JP); Toshiyuki Nishihara, Kanagawa (JP); Muriel Cohen, Webster, NY (US); Frederick Brady, Netanya (IL)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 15/529,195

(22) PCT Filed: Nov. 27, 2015

(86) PCT No.: PCT/JP2015/005906
§ 371 (c)(1),
(2) Date: May 24, 2017

(87) PCT Pub. No.: WO2016/092762
PCT Pub. Date: Jun. 16, 2016

(65) Prior Publication Data
US 2017/0359537 A1 Dec. 14, 2017

Related U.S. Application Data

(60) Provisional application No. 62/090,741, filed on Dec. 11, 2014.

(51) Int. Cl.
H04N 3/14 (2006.01)
H04N 5/335 (2011.01)
(Continued)

(52) U.S. Cl.
CPC ....... *H04N 5/3594* (2013.01); *H01L 27/1461* (2013.01); *H01L 27/14601* (2013.01);
(Continued)

(58) Field of Classification Search
CPC .... H04N 5/3651; H04N 5/374; H04N 5/3742; H04N 5/35518; H04N 5/35527;
(Continued)

(56) References Cited

U.S. PATENT DOCUMENTS 9,426,395 B2 * 8/2016 Jakobson ............. H04N 5/3651
2002/0018132 A1 * 2/2002 Watanabe ......... H01L 27/14609
348/308
(Continued)

FOREIGN PATENT DOCUMENTS

FR 2 920 590 A1 3/2009
WO WO 2014/064274 A1 5/2014

OTHER PUBLICATIONS

International Search Report and Written Opinion prepared by the European Patent Office dated Jun. 6, 2016, for International Application No. PCT/JP2015/005906.

*Primary Examiner* — Kelly L Jerabek
(74) *Attorney, Agent, or Firm* — Sheridan Ross P.C.

(57) ABSTRACT

An imaging apparatus with logarithmic characteristics includes: a photodiode that receives light; a well tap unit that fixes the potential of an N-type region of the photodiode; and a resetting unit that resets the photodiode, a P-type region of the photodiode outputting a voltage signal equivalent to a photocurrent subjected to logarithmic compression. The first potential to be supplied to the well tap unit is made lower than the second potential to be supplied to the resetting unit, so that the capacitance formed with the PN junction of the photodiode is charged when the resetting unit performs a
(Continued)

reset operation. The present technology can be applied to unit pixels having logarithmic characteristics.

14 Claims, 23 Drawing Sheets

(51) Int. Cl.
*H04N 5/359* (2011.01)
*H01L 27/146* (2006.01)
*H04N 5/357* (2011.01)
*H04N 5/3745* (2011.01)
*H04N 5/378* (2011.01)

(52) U.S. Cl.
CPC ..... *H01L 27/14612* (2013.01); *H04N 5/3575* (2013.01); *H04N 5/3591* (2013.01); *H04N 5/3745* (2013.01); *H04N 5/37455* (2013.01); *H04N 5/378* (2013.01)

(58) Field of Classification Search
CPC ......... H01L 27/14612; H01L 27/14636; H01L 27/14643; H01L 27/1461; H01L 27/14641
See application file for complete search history.

(56) References Cited

U.S. PATENT DOCUMENTS

| | | | |
|---|---|---|---|
| 2005/0280713 A1 | 12/2005 | Hagihara et al. | |
| 2006/0044436 A1* | 3/2006 | Watanabe | H01L 27/14601 348/308 |
| 2008/0252762 A1* | 10/2008 | Iwamoto | H04N 5/35518 348/301 |
| 2015/0281621 A1* | 10/2015 | Ni | H04N 5/3592 250/208.1 |
| 2015/0288900 A1* | 10/2015 | Lee | H04N 5/35527 348/222.1 |

* cited by examiner

IMAGING APPARATUS WITH LOGARITHMIC CHARACTERISTICS AND METHOD FOR DRIVING THE SAME

CROSS REFERENCE TO RELATED APPLICATIONS

This application is a national stage application under 35 U.S.C. 371 and claims the benefit of PCT Application No. PCT/JP2015/005906 having an international filing date of 27 Nov. 2015, which designated the United States, which PCT application claimed the benefit of U.S. Patent Application No. 62/090741 filed on Dec. 11, 2014, the disclosures of which are incorporated herein by reference in their entirety.

TECHNICAL FIELD

The present technology relates to imaging apparatuses, drive methods, and electronic apparatuses. More particularly, the present technology relates to an imaging apparatus, a drive method, and an electronic apparatus that are capable of increasing the frame rate.

BACKGROUND ART

Non-Patent Document 1 suggests a logarithmic sensor that operates a photodiode in an open circuit as in a solar cell, and measures an output voltage. According to this suggestion, the relationship in which a potential difference caused when a current flows in the forward direction of a PN junction, or a voltage, is proportional to the logarithm of the current is utilized. This forward current is replaced with a photocurrent generated through photoelectric conversion, and the forward voltage of the PN junction is monitored. As a result, a signal generated as a result of logarithmic compression of the photocurrent can be obtained.

Patent Documents 1 through 4 suggest techniques using such logarithmic sensors. Patent Document 1 and Patent Document 2 each suggest a combination of a logarithmic sensor in a solar cell mode and a general storage-type CMOS image sensor in a space-sharing manner. Patent Document 3 and Patent Document 4 each suggest a combination of both sensors in a time-sharing manner.

CITATION LIST

Patent Literature

PTL 1: Japanese Patent Application Laid-Open No. 2013-187727
PTL 2: Japanese Patent Application Laid-Open No. 2013-187728
PTL 3: Japanese Patent Application Laid-Open No. 2013-58960
PTL 4: Japanese Patent Application Laid-Open No. 2013-118595

Non Patent Literature

NPL 1: 2011 International Image Sensor Workshop (IISW), Jun. 9, 2011, Lecture R35, "A 768×576 Logarithmic Image Sensor with Photodiode in Solar Cell Mode"

SUMMARY OF INVENTION

Technical Problem

As disclosed in Patent Documents 1 through 4, a logarithmic sensor in a solar cell mode and a general storage-type CMOS image sensor are combined, because a logarithmic sensor in a solar cell mode has problems with characteristics in dark and low illumination conditions.

Where the structure of a logarithmic sensor in a solar cell mode is applied to the structure of a general storage-type CMOS image sensor, contacts are attached directly to the photodiodes. In such a case, the photodiodes may not be completely depleted, and therefore, kTC noise may not be removed. Also, a residual image is generated, and the photodiode surfaces may not be subjected to pinning Therefore, the white spots and the dark current derived from interfacial levels are degraded. Because of factors including the above, it is difficult to obtain a desired result in terms of characteristics in dark and low illumination conditions.

In view of this, a general storage-type CMOS image sensor solves the above problems by including transfer transistors and separating the modulation region as a floating diffusion region (FD) from the photodiodes. Therefore, there is a suggestion to combine a logarithmic sensor in a solar cell mode with a general storage-type CMOS image sensor so as to compensate for the poor characteristics of the solar-cell-mode logarithmic sensor in dark and low illumination conditions.

A logarithmic sensor in a solar cell mode and a storage-type CMOS image sensor can compensate for each other's shortcomings. However, these sensors might adversely affect each other's characteristics due to blooming, or the logarithmic sensor might put restrictions on the frame rate. Therefore, there is a demand for a higher frame rate through a reduction of adverse influence of blooming and improvement of the logarithmic sensor.

The present technology has been developed in view of those circumstances, and aims to reduce occurrences of blooming, and increase the frame rate.

Solution to Problem

A first imaging apparatus as one aspect of the present technology includes: a photodiode that receives light; a well tap unit that fixes the potential of an N-type region of the photodiode; and a resetting unit that resets the photodiode. The first imaging apparatus has logarithmic characteristics, and a P-type region of the photodiode outputs a voltage signal equivalent to a photocurrent subjected to logarithmic compression.

A first potential to be supplied to the well tap unit can be made lower than a second potential to be supplied to the resetting unit, to charge a capacitance generated at the photodiode when the resetting unit performs a reset operation.

The first imaging apparatus may further include a charging unit for a P-type region of the photodiode, the charging unit being formed in a position at a distance from the P-type region. A signal line for supplying charge may be connected to the charging unit.

After the resetting unit performs a reset operation, a predetermined potential may be applied so that the capacitance formed with the PN junction of the photodiode is charged.

A signal line for supplying a midpoint potential can be connected to each of the charging unit and the well tap unit.

For a predetermined time after the reset operation performed by the resetting unit, the well tap unit may cut off the midpoint potential supply to the N-type region, to charge the capacitance formed with the PN junction of the photodiode.

A signal line can be connected to the well tap unit, the signal line supplying a first potential when the resetting unit performs a reset operation, the signal line supplying a second potential when the resetting unit is not performing a reset operation.

An output from the photodiode can be subjected to two-stage amplification.

An output from the photodiode can be subjected to one-stage amplification.

When located adjacent to a photodiode having linear characteristics, the photodiode can handle a different carrier from a carrier being handled by the photodiode having linear characteristics.

A second imaging apparatus as one aspect of the present technology includes: a first photodiode having linear characteristics, the first photodiode including a first semi-conductor region and a second semiconductor region, a conductivity type of the second semiconductor region being the opposite of a conductivity type of the first semi-conductor region; and a second photodiode having logarithmic characteristics, the second photodiode including a third semiconductor region and a fourth semiconductor region, a conductivity type of the fourth semiconductor region being the opposite of a conductivity type of the third semiconductor region, wherein the first photodiode and the second photodiode are arranged in a space-sharing manner, and the conductivity type of the first semiconductor region is the opposite of the conductivity type of the third semiconductor region.

A first drive method as one aspect of the present technology is a drive method for an imaging apparatus that has logarithmic characteristics and includes: a photodiode that receives light; a well tap unit that fixes the potential of an N-type region of the photodiode; and a resetting unit that resets the photodiode. The first drive method includes the step of charging a capacitance formed with the PN junction of the photodiode by applying a lower potential than a potential to be supplied to the resetting unit, when the resetting unit performs a reset operation.

A second drive method as one aspect of the present technology is a drive method for an imaging apparatus that has logarithmic characteristics and includes: a photodiode that receives light; a well tap unit that fixes the potential of an N-type region of the photodiode; and a resetting unit that resets the photodiode. The second drive method includes the step of charging a capacitance formed with the PN junction of the photodiode by applying a predetermined potential to a charging unit for a P-type region forming the photodiode after the resetting unit performs a reset operation, the charging unit being formed in a position at a distance from the P-type region.

A third drive method as one aspect of the present technology is a drive method for an imaging apparatus that has logarithmic characteristics and includes: a photodiode that receives light; a well tap unit that fixes the potential of an N-type region of the photodiode; and a resetting unit that resets the photodiode. The third drive method includes the step of supplying a midpoint potential to a charging unit for a p-type region forming the photodiode, supplying the midpoint potential to the N-type region formed in a position at a distance from the P-type region forming the photodiode except for a predetermined time after a reset operation, and cutting off the midpoint potential supply for the predetermined time after the reset operation, the charging unit being formed in a position at a distance from the P-type region.

A fourth drive method as one aspect of the present technology is a drive method for an imaging apparatus that has logarithmic characteristics and includes: a photodiode that receives light; a well tap unit that fixes the potential of an N-type region of the photodiode; and a resetting unit that resets the photodiode. The fourth drive method includes the step of supplying a first potential to the N-type region forming the photodiode when the resetting unit performs a reset operation, and supplying a second potential to the N-type region when the resetting unit is not performing the reset operation.

A first electronic apparatus as one aspect of the present technology includes: an imaging apparatus that has logarithmic characteristics and includes: a photodiode that receives light; a well tap unit that fixes the potential of an N-type region of the photodiode; and a resetting unit that resets the photodiode, a P-type region of the photodiode outputting a voltage signal equivalent to a photocurrent subjected to logarithmic compression; and a signal processing unit that performs signal processing on a signal output from the imaging apparatus.

A second electronic apparatus as one aspect of the present technology includes: an imaging apparatus including: a first photodiode having linear characteristics, the first photodiode including a first semiconductor region and a second semiconductor region, a conductivity type of the second semiconductor region being the opposite of a conductivity type of the first semiconductor region; and a second photodiode having logarithmic characteristics, the second photodiode including a third semiconductor region and a fourth semiconductor region, a conductivity type of the fourth semiconductor region being the opposite of a conductivity type of the third semiconductor region, the first photodiode and the second photodiode being arranged in a space-sharing manner, and the conductivity type of the first semiconductor region being the opposite of the conductivity type of the third semiconductor region; and a signal processing unit configured to perform signal processing on a signal output from the imaging apparatus.

In the first imaging apparatus as one aspect of the present technology, the capacitance formed with the PN junction of the photodiode is charged.

In the second imaging apparatus as one aspect of the present technology, photodiodes with different characteristics are arranged in a space-sharing manner, and the semiconductor regions forming the photodiode are of different conductivity types from each other.

In the first through fourth drive methods as one aspect of the present technology, the imaging apparatus is driven to charge the capacitance formed with the PN junction of the photodiode.

The first electronic apparatus as one aspect of the present technology includes the first imaging apparatus, and signals from the first imaging apparatus are processed. In the second electronic apparatus as one aspect of the present technology includes the second imaging apparatus, and signals from the second imaging apparatus are processed.

Advantageous Effects of Invention

According to one aspect of the present technology, one of the sensors is prevented from adversely affecting the characteristics of the other one of the sensors due to blooming, and an imaging apparatus having logarithmic characteristics is improved. Accordingly, the frame rate can be increased.

It should be noted that effects are not necessarily limited to those disclosed here, and may be any of the effects disclosed in the present disclosure.

DESCRIPTION OF EMBODIMENTS

Figure 1:
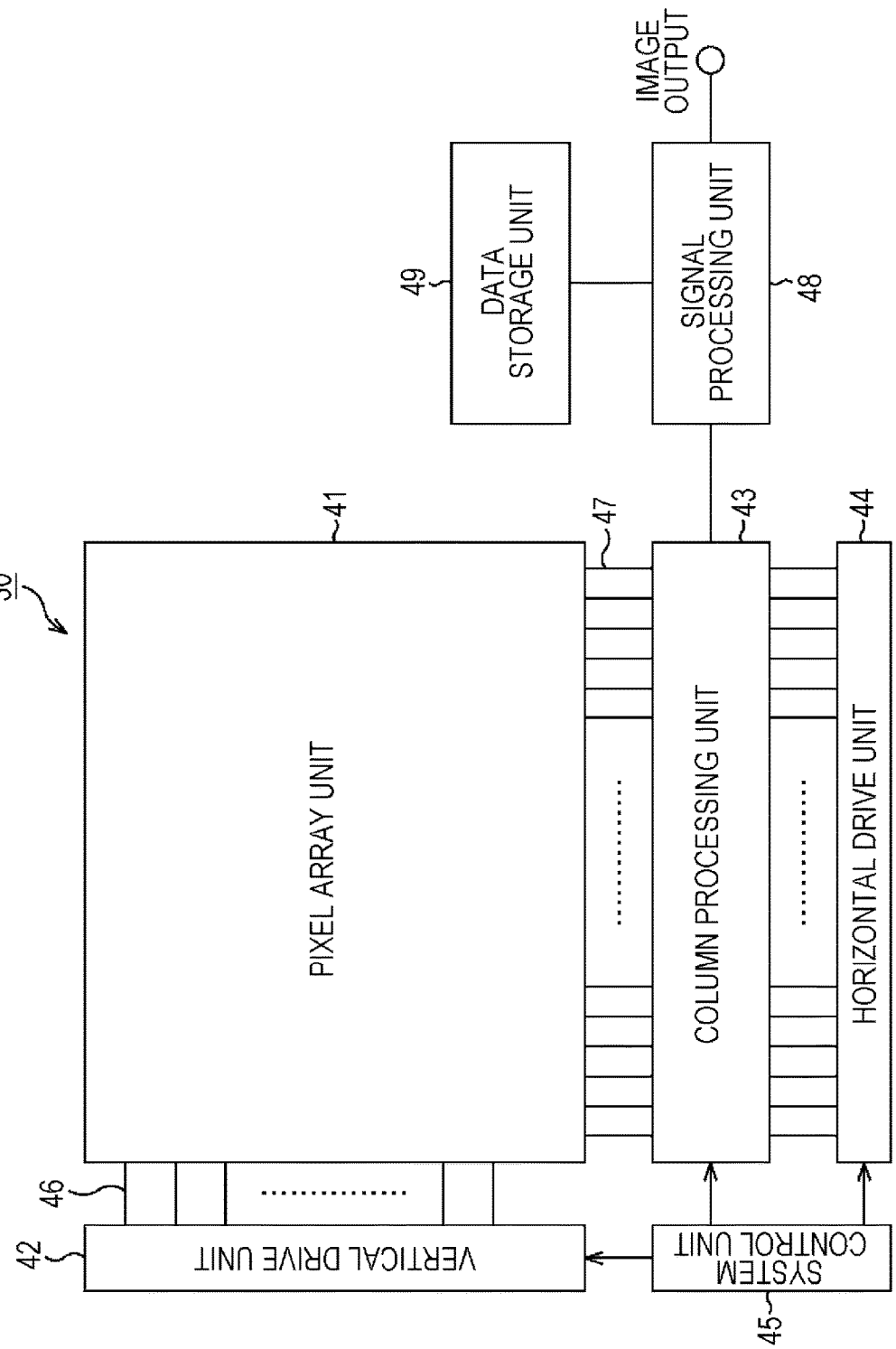
FIG. 1 is a diagram showing the structure of an embodiment of an imaging apparatus to which the present technology is applied.

The following is a description of modes (hereinafter referred to as embodiments) for carrying out the present technology. The explanation will be made in the following order.

1. Structure of a solid-state imaging element
2. Structure of a linear pixel
3. Structure of a logarithmic pixel
4. Structure of a logarithmic pixel according to a first embodiment
5. Structure of a logarithmic pixel according to a second embodiment
6. Structure of a logarithmic pixel according to a third embodiment
7. Structure of a logarithmic pixel according to a fourth embodiment
8. Measures against blooming
9. Structure of an electronic apparatus
10. Examples of application of an imaging apparatus <Structure of a Solid-State Imaging Element>

FIG. 1 is a block diagram showing an example structure of a CMOS (Complementary Metal Oxide Semiconductor) image sensor as a solid-state imaging element to which the present disclosure is applied.

A CMOS image sensor 30 includes a pixel array unit 41, a vertical drive unit 42, a column processing unit 43, a horizontal drive unit 44, and a system control unit 45. The pixel array unit 41, the vertical drive unit 42, the column processing unit 43, the horizontal drive unit 44, and the system control unit 45 are formed on a semiconductor substrate (chip) that is not shown in the drawing.

In the pixel array unit 41, unit pixels each including a photoelectric conversion element that generates optical charge corresponding to incident light in amount and stores the optical charge are two-dimensionally arranged in a matrix fashion. Hereinafter, the optical charge corresponding to incident light in amount will be sometimes referred to simply as "charge", and the unit pixels will be sometimes referred to simply as "pixels".

First pixels and second pixels with different characteristics coexist in the pixel array unit 41. The first pixels are pixels each including a photodiode (PD) and having linear characteristics (the first pixels will be hereinafter also referred to as linear pixels, as appropriate). The second pixels are pixels each including a photodiode and having logarithmic characteristics (the second pixels will be hereinafter also referred to as logarithmic pixels, as appropriate). The second pixels are driven in a solar cell mode. The respective pixels will be described later in detail.

In the pixel array unit 41, pixel drive lines 46 are further formed in the transverse direction of the drawing (the array direction of pixels in the pixel rows) for the respective rows in the matrix-like pixel array, and vertical signal lines 47 are formed in the horizontal direction (the array direction of pixels in the pixel columns) for the respective columns. One end of each of the pixel drive lines 46 is connected to each corresponding one of output terminals of the vertical drive unit 42.

The CMOS image sensor 30 further includes a signal processing unit 48 and a data storage unit 49. The signal processing unit 48 and the data storage unit 49 may be an external signal processing unit provided on a different substrate from the CMOS image sensor 30, such as a DSP (Digital Signal Processor) or a processing unit by software, or may be mounted on the same substrate as the CMOS image sensor 30.

The vertical drive unit 42 is a pixel drive unit that is formed with a shift register, an address decoder, or the like, and drives the respective pixels of the pixel array unit 41 all at once or on a row-by-row basis. Although not specifically illustrated in the drawing, this vertical drive unit 42 is designed to have a read scan system and a sweep scan system, or collective sweeping and collective transfer.

To read signals from the unit pixels, the read scan system performs selective scanning sequentially on the unit pixels of the pixel array unit 41 on a row-by-row basis. As for sweeping, in the case of row driving (a rolling shutter operation), sweep-scanning is performed on a read row to be subjected to read-scanning by the read scan system earlier than the read-scanning by the time equivalent to the difference in shutter speed. In the case of global exposure (a global shutter operation), collective sweeping is performed earlier than collective transfer by the time equivalent to the difference in shutter speed.

By this sweeping, unnecessary charge is swept out of the photoelectric conversion elements of the unit pixels of the read row (the unit pixels are reset). By virtue of the unnecessary charge sweeping (or the resetting), a so-called electronic shutter operation is performed. Here, an electronic shutter operation means an operation to eliminate optical charge from the photoelectric conversion elements and newly start exposure (or start storing optical charge).

The signals read by the read scan system performing a read operation correspond to the amount of incident light observed after the previous read operation or electronic shutter operation. In the case of row driving, the period from the timing to read in the previous read operation or the timing to sweep in the previous electronic shutter operation till the timing to read in the current read operation is the optical charge storage period (exposure period) in the unit pixels. In the case of global exposure, the period from collective sweeping till collective transfer is the storage period (exposure period).

The pixel signals that are output from the respective unit pixels of the pixels row selectively scanned by the vertical drive unit 42 are supplied to the column processing unit 43 through the respective vertical signal lines 47. For the respective pixel columns of the pixel array unit 41, the column processing unit 43 performs predetermined signal processing on the pixel signals output from the respective unit pixels of the selected row through the vertical signal lines 47, and temporarily holds the pixel signals subjected to the signal processing.

Specifically, the column processing unit 43 performs at least a noise removal process, such as a CDS (Correlated Double Sampling) process, as the signal processing. By virtue of the correlated double sampling performed by the column processing unit 43, fixed pattern noise unique to pixels, such as reset noise and threshold variation among the amplifier transistors, is removed. In addition to the noise removal process, the column processing unit 43 may have an AD (analog-digital) conversion function, for example, so that signal levels can be output as digital signals.

The horizontal drive unit 44 is formed with a shift register, an address decoder, or the like, and sequentially selects the unit circuits corresponding to the pixel columns of the column processing unit 43. Through the selective scanning performed by the horizontal drive unit 44, the pixel signals subjected to signal processing by the column processing unit 43 are sequentially output to the signal processing unit 48.

The system control unit 45 is formed with a timing generator or the like that generates various kinds of timing signals, and performs drive control on the vertical drive unit 42, the column processing unit 43, the horizontal drive unit 44, and the like based on the various kinds of timing signals generated by the timing generator.

The signal processing unit 48 includes at least an addition processing function, and performs various kinds of signal processing such as an addition process on the pixel signals that are output from the column processing unit 43. The data storage unit 49 temporarily stores the necessary data for processing the signal processing at the signal processing unit 48.

<Structure of a Linear Pixel>

Next, the specific structure of each of the unit pixels arranged in a matrix-like fashion in the pixel array unit 41 shown in FIG. 1 is described.

Figure 2:
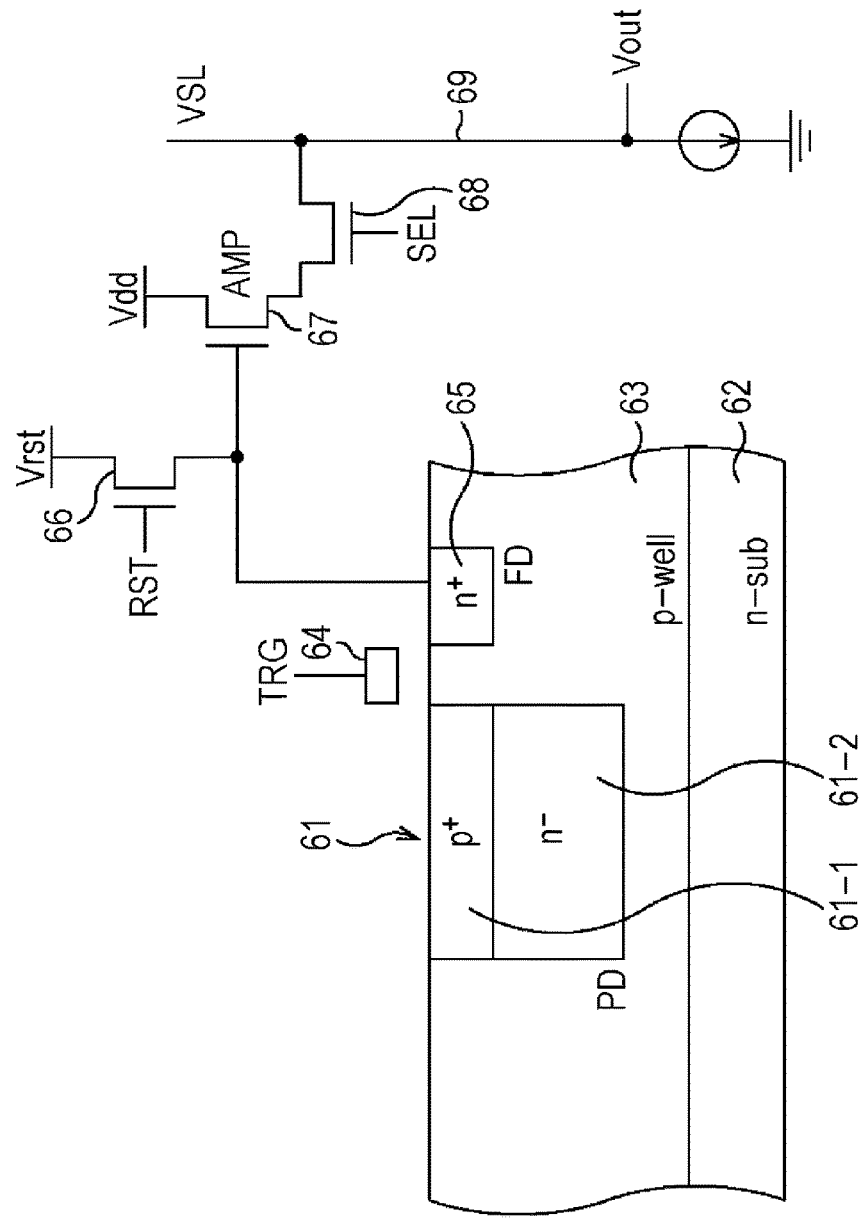
FIG. 2 is a diagram showing the structure of a linear pixel.
Figure 3:
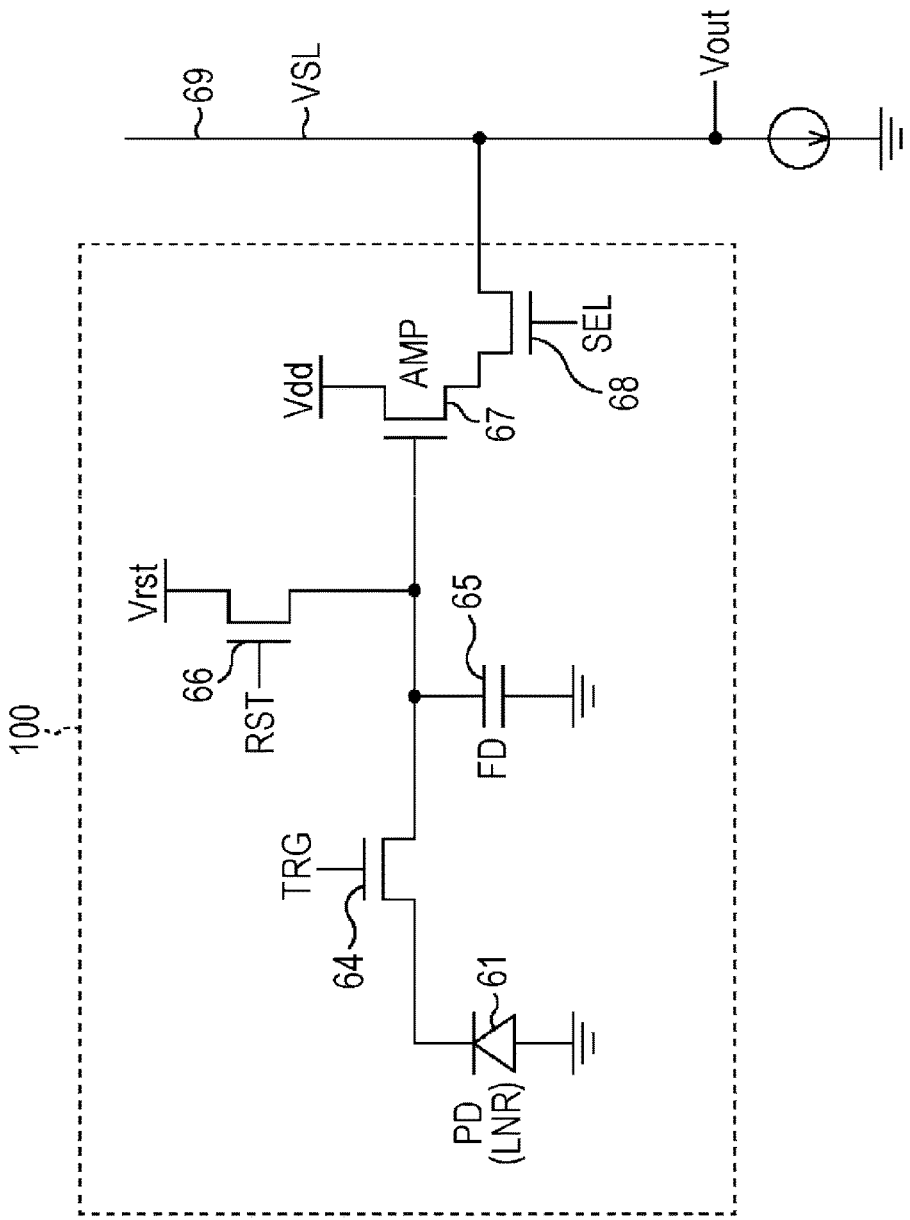
FIG. 3 is a diagram showing the circuit configuration of the linear pixel.

FIG. 2 shows an example structure of a unit pixel. FIG. 3 shows a circuit configuration of the unit pixel. The unit pixel shown in FIGS. 2 and 3 is a linear pixel. Hereinafter, the linear pixel will be referred to as the linear pixel 100.

The linear pixel 100 includes a photodiode (PD) 61 as a photoelectric conversion element, for example. The photodiode 61 is a buried photodiode that is formed by burying an n-type buried layer 61-2 under a p-type layer 61-1 formed at the substrate surface side of a p-type well layer 63 formed on an n-type substrate 62.

In addition to the photodiode 61, the linear pixel 100 includes a TRG gate 64 and a floating diffusion (FD) region 65. The TRG gate 64 transfers the charge stored in the photodiode 61 to the floating diffusion region 65, as a drive signal TRG is applied to the gate electrode of the TRG gate 64.

The floating diffusion region 65 is a charge-voltage conversion unit formed with an n-type layer, and converts the charge transferred by the TRG gate 64 into voltage.

The linear pixel 100 further includes a reset transistor (RST) 66, an amplifier transistor (AMP) 67, and a select transistor (SEL) 68. In the example illustrated in FIG. 2, n-channel MOS transistors are used as the reset transistor 66, the amplifier transistor 67, and the select transistor 68. However, the combination of the conductivity types of the reset transistor 66, the amplifier transistor 67, and the select transistor 68 is not limited to the above combination.

The reset transistor 66 is connected between a power supply Vrst and the floating diffusion region 65. As a drive signal RST is applied to the gate electrode, the reset transistor 66 resets the floating diffusion region 65. The amplifier transistor 67 has a drain electrode connected to a power supply Vdd, has a gate electrode connected to the floating diffusion region 65, and reads the voltage of the floating diffusion region 65.

The select transistor 68 has a drain electrode connected to the source electrode of the amplifier transistor 67, and has a source electrode connected to a vertical signal line 69. When a drive signal SEL is applied to the gate electrode, the select transistor 68 selects the linear pixel 100 from which a pixel signal is to be read. It should be noted that the select transistor 68 may be connected between the power supply Vdd and the drain electrode of the amplifier transistor 67.

One or more transistors among the reset transistor 66, the amplifier transistor 67, and the select transistor 68 may not be prepared depending on the pixel signal read method employed.

Although an n-type buried channel is formed in the p-type well layer 63 in the linear pixel 100 shown in FIG. 2, the reverse conductivity types may be employed.

As will be described later, in a case where the linear pixel 100 is placed adjacent to a logarithmic pixel, the linear pixel 100 and the logarithmic pixel are made to handle different carriers, so as to prevent blooming. In such a structure, one of the linear pixel 100 and the logarithmic pixel handles electrons as the carrier, and the other one of the linear pixel 100 and the logarithmic pixel handles holes as the carrier. Therefore, whether to form an n-type buried channel in the p-type well layer 63 or whether to employ the reverse conductivity types in the structure of the linear pixel 100 is determined depending on which carrier is handled by the linear pixel 100.

Figure 4:
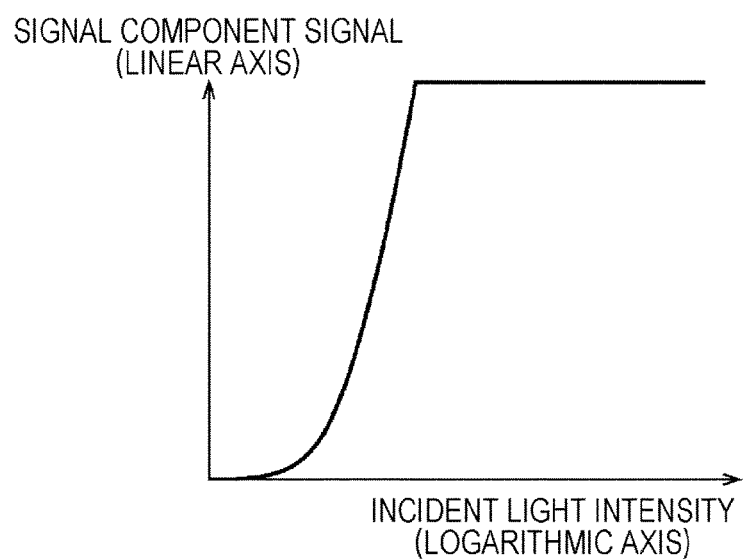
FIG. 4 is a diagram for explaining the signal characteristics of the linear pixel.

FIG. 4 is a graph showing an example of the photoelectric conversion characteristics of the linear pixel 100 shown in FIGS. 2 and 3. The ordinate axis (linear axis) indicates the signal component signal, and the abscissa axis (logarithmic axis) indicates the incident light intensity. As can be seen from FIG. 4, the linear pixel 100 has such linear photoelectric conversion characteristics that the signal component signal linearly increases as the incident light intensity becomes higher.

Further, it is apparent that, when the incident light intensity exceeds a predetermined value, the signal component signal is saturated. Since the abscissa axis is the logarithmic axis in the graph shown in FIG. 4, the curve shown in FIG. 4 is the linear output with respect to the incident light intensity. Accordingly, as can be seen from FIG. 4, the linear characteristics exhibit a narrow dynamic range, but indicate a high sensitivity.

<Structure of a Logarithmic Pixel>

Next, the structure of each of the logarithmic pixels among the unit pixels arranged in a matrix-like fashion in the pixel array unit 41 shown in FIG. 1 is described.

Figure 5:
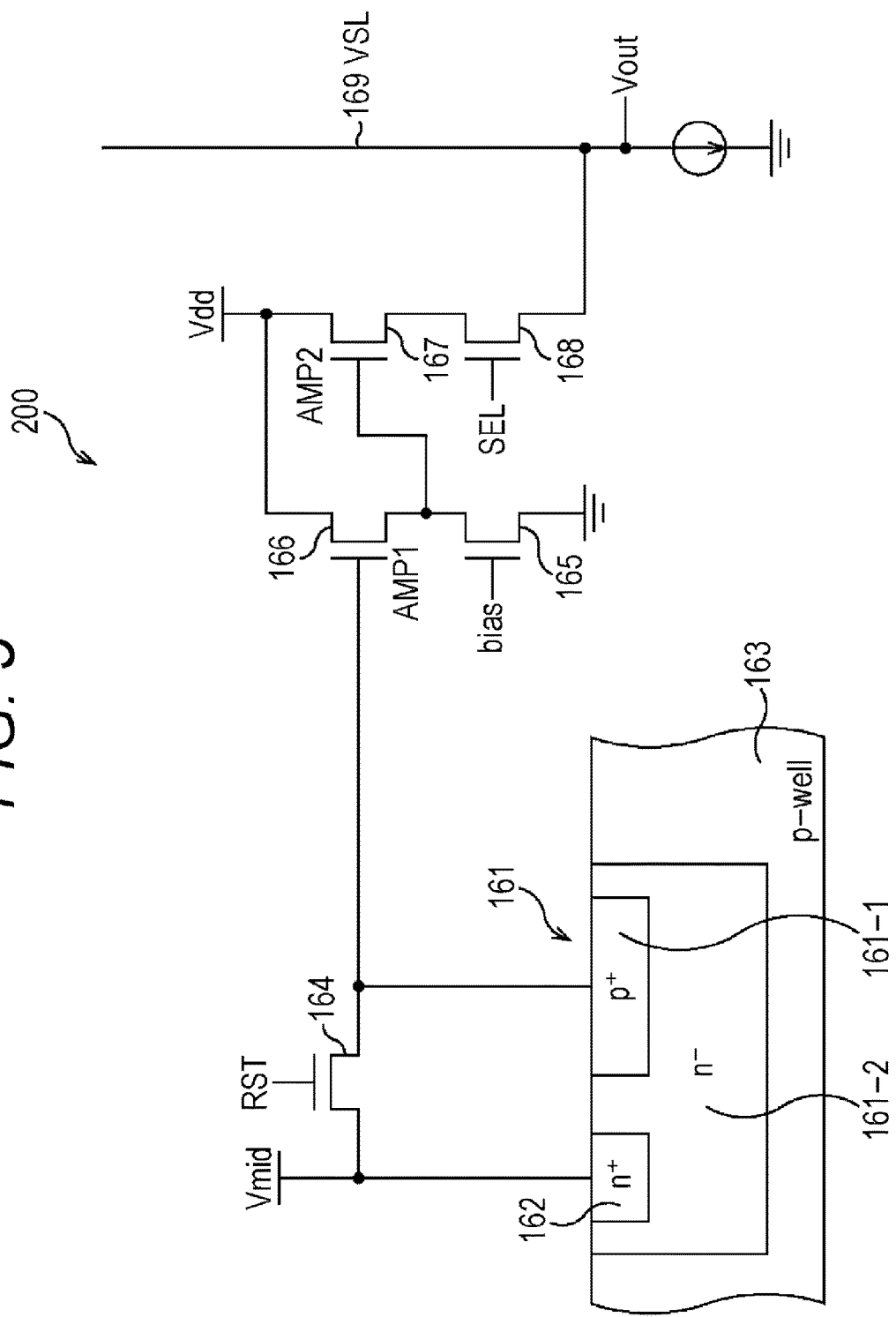
FIG. 5 is a diagram showing the structure of a logarithmic pixel.
Figure 6:
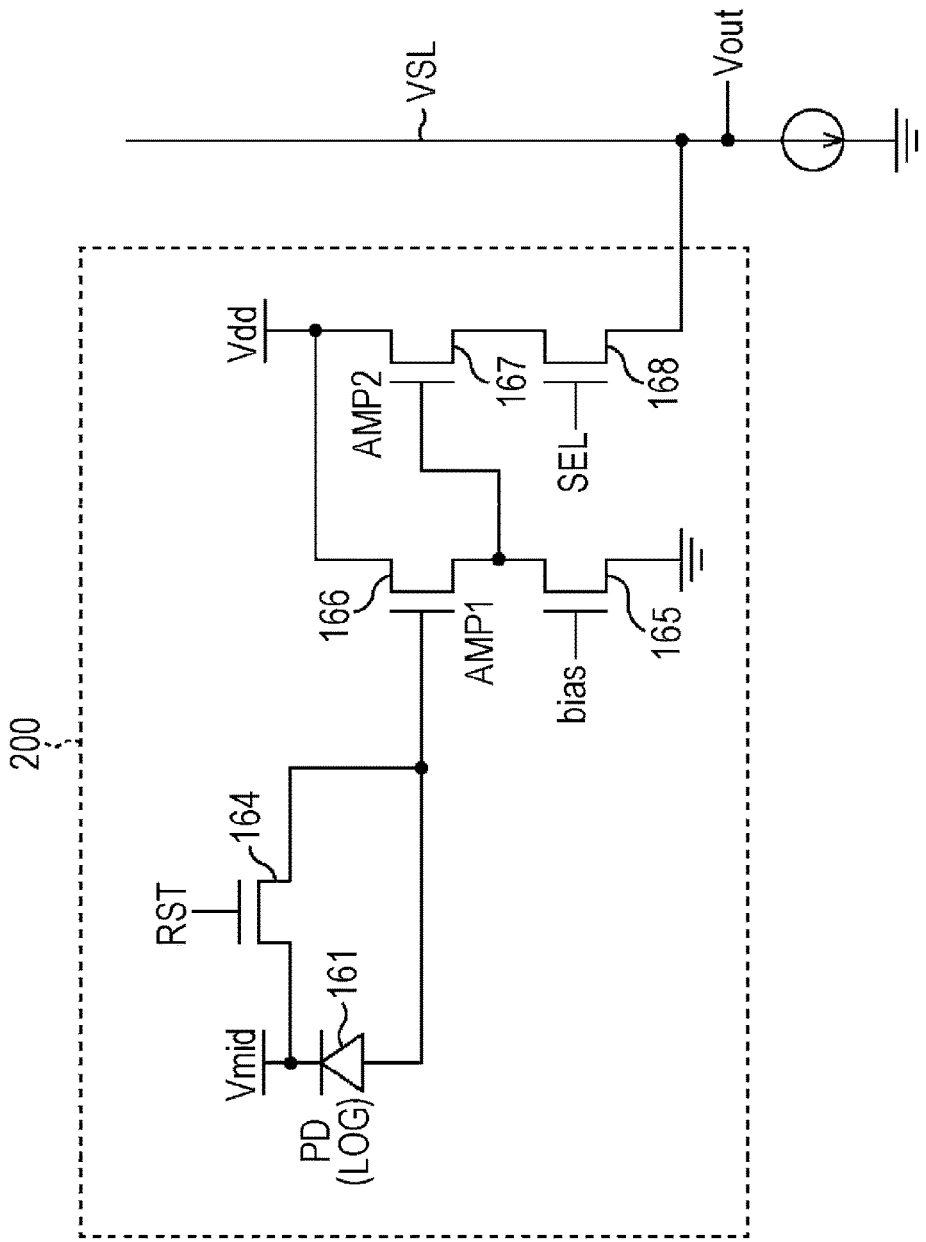
FIG. 6 is a diagram showing the circuit configuration of the logarithmic pixel.

FIG. 5 shows an example structure of a unit pixel. FIG. 6 shows a circuit configuration of the unit pixel. The unit pixel shown in FIGS. 5 and 6 is a logarithmic pixel.

A logarithmic pixel 200 characteristically has a capacitance derived from a PN junction, and a logarithmic region starts after this capacitance is charged, as will be described later. Since a storage time for charging may be required, it is difficult to increase the frame rate. However, a logarithmic pixel that can increase the frame rate by shortening this storage time will be described.

First, for a comparison purpose, a logarithmic pixel 200 that is not designed to increase the frame rate is described so as to explain the necessity of the storage time and the difficulty of increasing the frame rate, with reference to FIGS. 5 and 6.

The logarithmic pixel 200 includes a photodiode 161, a reset transistor 164, a first amplifier transistor 166, a second amplifier transistor 167, and a select transistor 168.

Like the linear pixel 100, the logarithmic pixel 200 includes the photodiode 161 as a photoelectric conversion element. The photodiode 161 is a surface-type photodiode in which a p-type layer 161-1 is formed at the substrate surface side of an n-type well layer 161-2.

An $n^+$-region 162 forms part of the photodiode 161, and is used as a well tap. The $n^+$-region 162 is equivalent to the cathode side of the photodiode 161, and a power supply Vmid that supplies the midpoint potential is connected to the cathode of the photodiode 161. The reset transistor 164 is connected to the anode of the photodiode 161.

When the photodiode 161 is reset, the reset transistor 164 is switched on, and the power supply Vmid is applied to the cathode and the anode. Accordingly, the photodiode 161 is reset in a zero-bias state, and a current corresponding to the incident light intensity flows at the time of exposure. With this current, the voltage between the anode and the cathode of the photodiode 161 varies.

The reset transistor 164 is formed with an nMOS, for example, and a reset signal RST is applied to the gate thereof. When the reset signal RST="Hi", the reset transistor 164 is switched on, and resets the photodiode 161 in a zero-bias state.

The first amplifier transistor 166 is formed with an nMOS, for example. The gate of the first amplifier transistor 166 is connected to the anode side of the photodiode 161. A power supply Vdd that supplies a voltage Vdd is connected to one terminal of the first amplifier transistor 166, and a bias transistor 165 that supplies a bias voltage "bias" is connected to the other terminal.

The second amplifier transistor 167 is formed with an nMOS, for example, and the gate thereof is connected to the bias transistor 165 that supplies the bias voltage "bias". The power supply Vdd that supplies the voltage Vdd is connected to one terminal of the second amplifier transistor 167, and the select transistor 168 is connected to the other terminal.

The first amplifier transistor 166 and the second amplifier transistor 167 current-amplify the voltage between the anode and the cathode of the photodiode 161, and supply the current-amplified voltage to the select transistor 168.

The select transistor 168 is formed with an nMOS, for example, and a select signal SEL is applied to the gate thereof. One terminal of the select transistor 168 is connected to the second amplifier transistor 167, and the other terminal is connected to a vertical signal line VSL. When the select signal SEL="Hi", the select transistor 168 is switched on, and outputs the voltage of the photodiode 161, which has been current-amplified as an image signal by the first amplifier transistor 166 and the second amplifier transistor 167, to the vertical signal line VSL.

Figure 7:
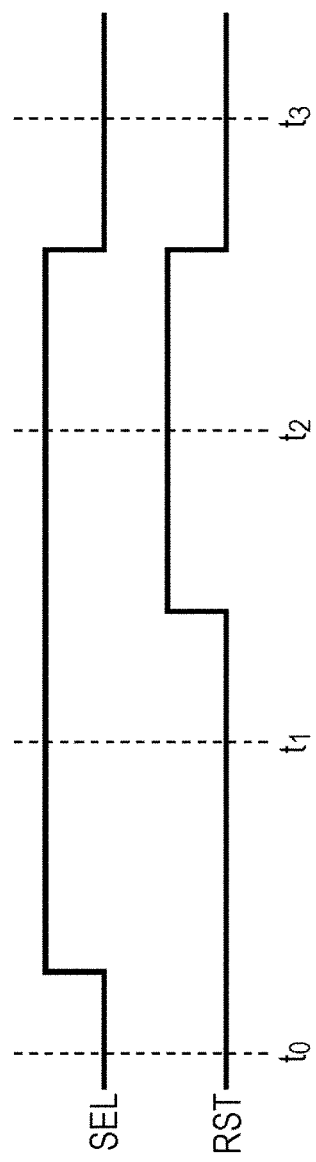
FIG. 7 is a timing chart for explaining operation of the logarithmic pixel.

FIG. 7 is a timing chart of the logarithmic pixel 200. At time t0, exposure is being conducted, and the voltage corresponding to the incident light intensity is generated at the cathode of the photodiode 161 (not shown).

In the state at time t1, the select signal SEL="Hi", and the voltage that is at a signal level and is generated at the cathode of the photodiode 161 is read out as a noise/signal component signal to the column processing unit 43 (FIG. 1). The column processing unit 43 performs AD conversion on the analog noise/signal component signal by measuring the time until the level of a signal RAMP that is output from a ramp wave generating circuit (not shown) exceeds the level of the noise/signal component signal.

In the state at time t2, the reset signal RST="Hi", the reset transistor 164 and the select transistor 168 are switched on, the voltage at the cathode of the photodiode 161 drops from the signal level to the reset level, and the reset level is read out as a noise component signal to the column processing unit 43. The column processing unit 43 then performs AD conversion on the analog noise component signal by measuring the time until the signal RAMP that is output from the ramp wave generating circuit (not shown) exceeds the level of the noise component signal.

The column processing unit 43 then removes the digital noise component signal from the digital noise/signal component signal, and outputs the digital signal component signal as an image signal.

At time t3, the reset signal RST="Lo", the select signal SEL="Lo", and the reset transistor 164 and the select transistor 168 are switched off.

Thereafter, such a drive sequence is executed in one horizontal period, and this drive sequence is repeated, to sequentially acquire image signals row by row.

Figure 8:
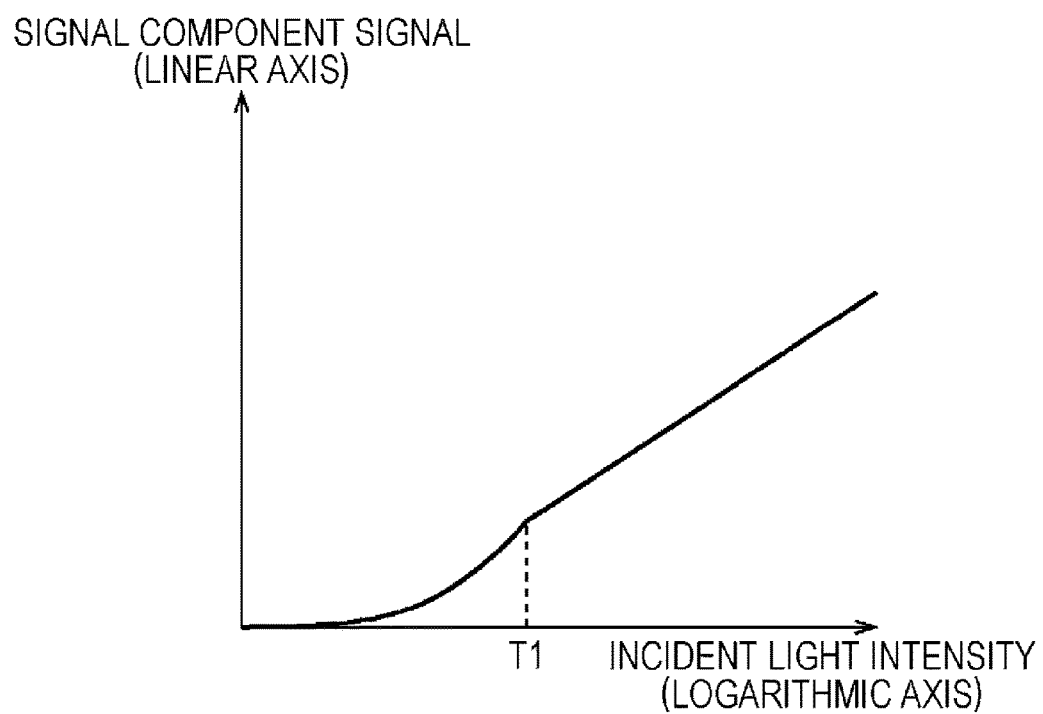
FIG. 8 is a diagram for explaining the signal characteristics of the logarithmic pixel.

FIG. 8 is a graph showing the photoelectric conversion characteristics of the logarithmic pixel 200. The ordinate axis (linear axis) indicates the signal component signal, and the abscissa axis (logarithmic axis) indicates the incident light intensity. As can be seen from FIG. 8, the logarithmic pixel 200 has such logarithmic photoelectric conversion characteristics that the signal component signal logarithmically increases as the incident light intensity becomes higher. It should be noted that, in FIG. 8, the abscissa axis is the logarithmic axis, and therefore, the logarithmic variation is represented by a straight line.

As shown in FIG. 8, the logarithmic region of the logarithmic pixel 200 starts after time T1. This is because the logarithmic pixel 200 has a capacitance derived from a PN junction, and the logarithmic region starts after this capacitance is charged. Having such characteristics, the logarithmic pixel 200 has the problem that the storage time until the logarithmic region starts is long in low illumination conditions.

If the storage time until the logarithmic region of the logarithmic pixel 200 starts is long in low illumination conditions, there is a possibility that increasing the frame rate is difficult. In view of this, logarithmic pixels that can shorten the storage time will be described below.

<Structure of a Logarithmic Pixel According to a First Embodiment>

Figure 9:
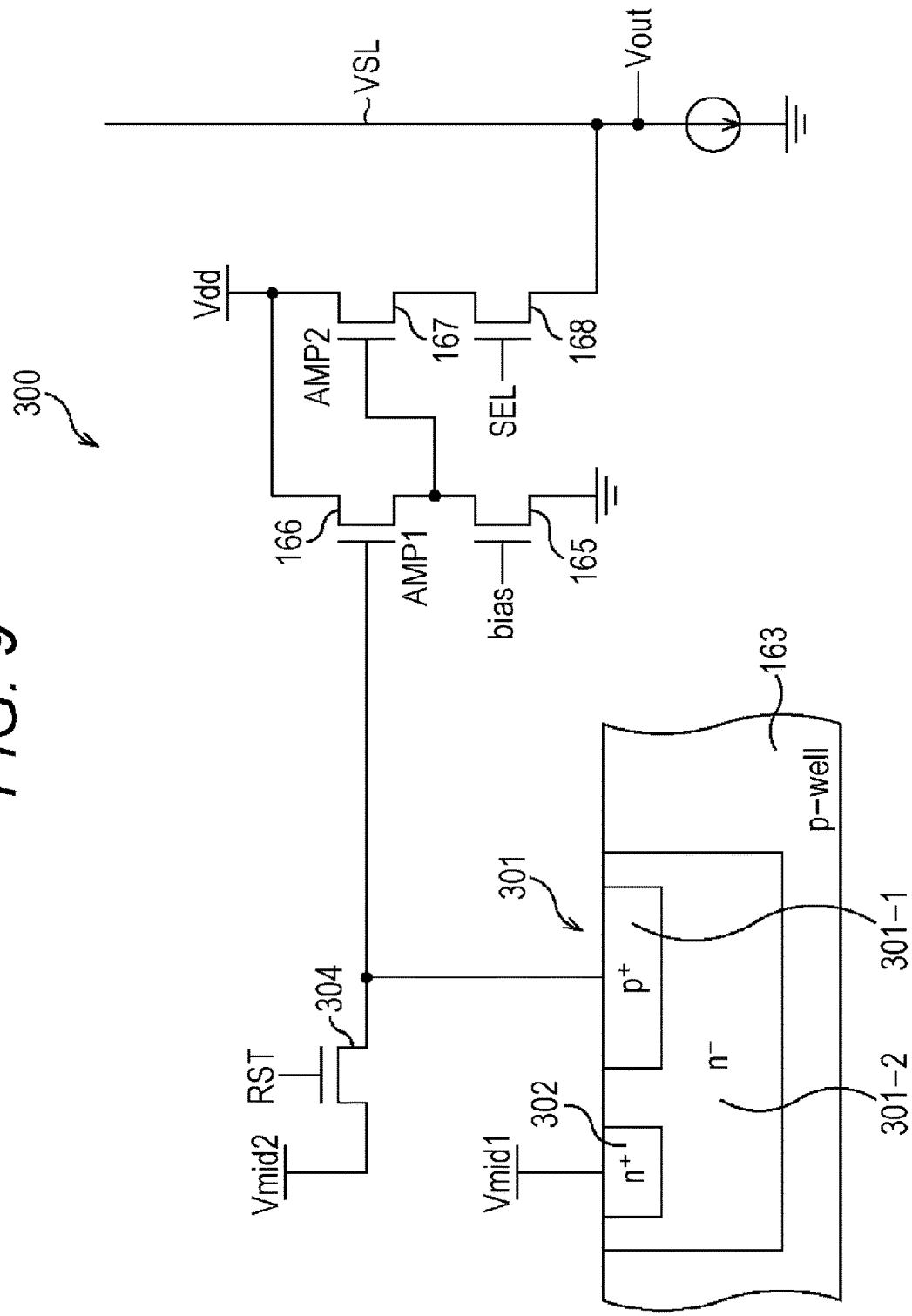
FIG. 9 is a diagram showing the structure of a logarithmic pixel according to a first embodiment.
Figure 10:
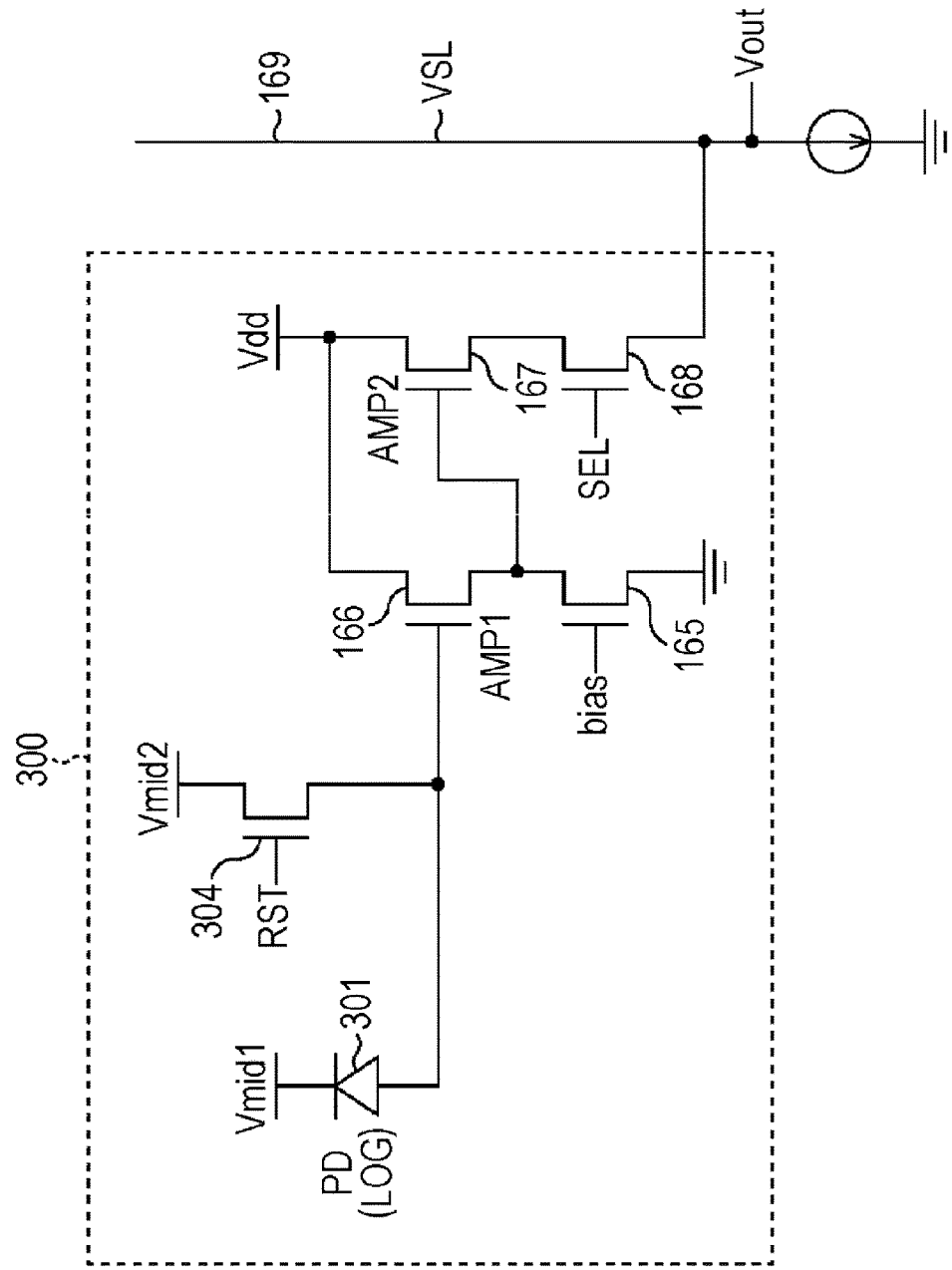
FIG. 10 is a diagram showing the circuit configuration of the logarithmic pixel according to the first embodiment.

A logarithmic pixel according to a first embodiment is now described. FIG. 9 shows an example structure of the logarithmic pixel according to the first embodiment, and FIG. 10 shows a circuit configuration thereof. In the description below, the components having the same functions as those of the logarithmic pixel 200 shown in FIGS. 5 and 6 are denoted by the same reference numerals as those used in FIGS. 5 and 6, and explanation of them is not provided herein.

The layout of and the connections among a bias transistor 165, a first amplifier transistor 166, a second amplifier transistor 167, a select transistor 168 are basically the same as those in the logarithmic pixel 200 shown in FIGS. 5 and 6.

The logarithmic pixel 300 shown in FIGS. 9 and 10 has a function to charge a photodiode 301. The photodiode 301 is a surface-type photodiode in which a p-type layer 301-1 is formed at the substrate surface side of an n-type well layer 301-2, as in the logarithmic pixel 200. The p-type layer 301-1 (P-type region) of the photodiode 301 has logarithmic characteristics to output a voltage signal equivalent to a photocurrent subjected to logarithmic compression.

An $n^+$-region 302 forms part of the photodiode 301, and is used as a well tap. In the logarithmic pixel 200 shown in FIGS. 5 and 6, this $n^+$-region 162 is connected to the power supply Vmid of a reset drain, like the reset transistor 164.

In the logarithmic pixel 300 shown in FIGS. 9 and 10, the power supplies connected to the $n^+$-region 302 and a reset transistor 304 are separated from each other, and the $n^+$-region 302 and the reset transistor 304 are connected to different power supplies from each other. The reset transistor 304 is connected to a power supply Vmid2 of a reset drain, and a midpoint potential Vmid2 is applied to the reset transistor 304 when a reset operation is performed. The $n^+$-region 302 is connected to a power supply Vmid1.

The potential Vmid1 of the power supply Vmid1 and the potential Vmid2 of the power supply Vmid2 satisfy the relationship, potential Vmid1<potential Vmid2, for example. As the potentials are set so as to satisfy the relationship, potential Vmid1<potential Vmid2, the output node ($p^+$-region 301-1) is biased in the forward direction with respect to the $n^+$-region 302 when the reset transistor 304 performs a reset operation. As a result, the output node is positively charged.

As described above, in the logarithmic pixel 300 to which the present technology is applied, the logarithmic region characteristically starts after the capacitance derived from a PN junction is charged, and the logarithmic pixel 300 has the function to charge this capacitance.

The drive method implemented in the logarithmic pixel 300 is based on the timing chart shown in FIG. 7, as in the logarithmic pixel 200. Referring again to FIG. 7, in the state at time t0, exposure is being conducted, and the voltage corresponding to the incident light intensity is generated in the photodiode 301.

In the state at time t1, the select signal SEL="Hi", and the voltage that is at a signal level and is generated at the anode of the photodiode 301 is read out as a noise/signal component signal to the column processing unit 43 (FIG. 1).

In the state at time t2, the reset signal RST="Hi", the reset transistor 304 and the select transistor 168 are switched on, the voltage at the anode of the photodiode 301 drops from the signal level to the reset level, and the reset level is read out as a noise component signal to the column processing unit 43.

In the state at time t2, the output node is biased in the forward direction with respect to the $n^+$-region 302, and the output node is positively charged. Accordingly, the time until the logarithmic region starts is shortened. Charge is injected into the capacitance formed with the PN junction of the photodiode 301 while a reset operation is being performed. As the capacitance is charged in this manner, the time until the logarithmic region starts is shortened as described above.

At time t3, the reset signal RST="Lo", the select signal SEL="Lo", and the reset transistor 164 and the select transistor 168 are returned to the off-state.

As the photodiode 301 is charged in this manner while being reset, the storage time can be shortened. As the storage time is shortened, the frame rate can also be increased.

<Structure of a Logarithmic Pixel According to a Second Embodiment>

Next, a logarithmic pixel according to a second embodiment is described. A logarithmic pixel 400 according to the second embodiment has a function to charge the photodiode, like the logarithmic pixel 300 according to the first embodiment.

Figure 11:
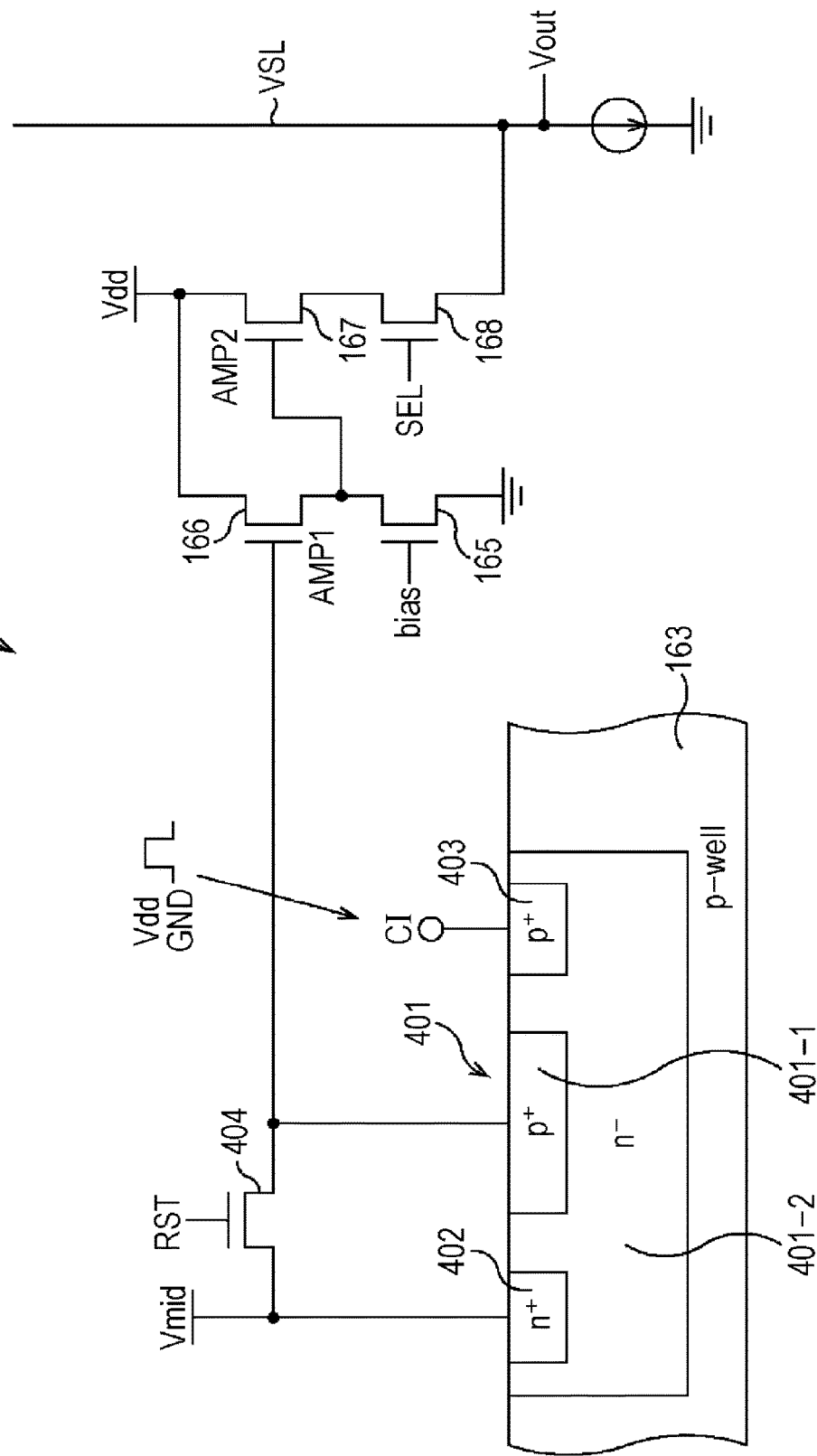
FIG. 11 is a diagram showing the structure of a logarithmic pixel according to a second embodiment.
Figure 12:
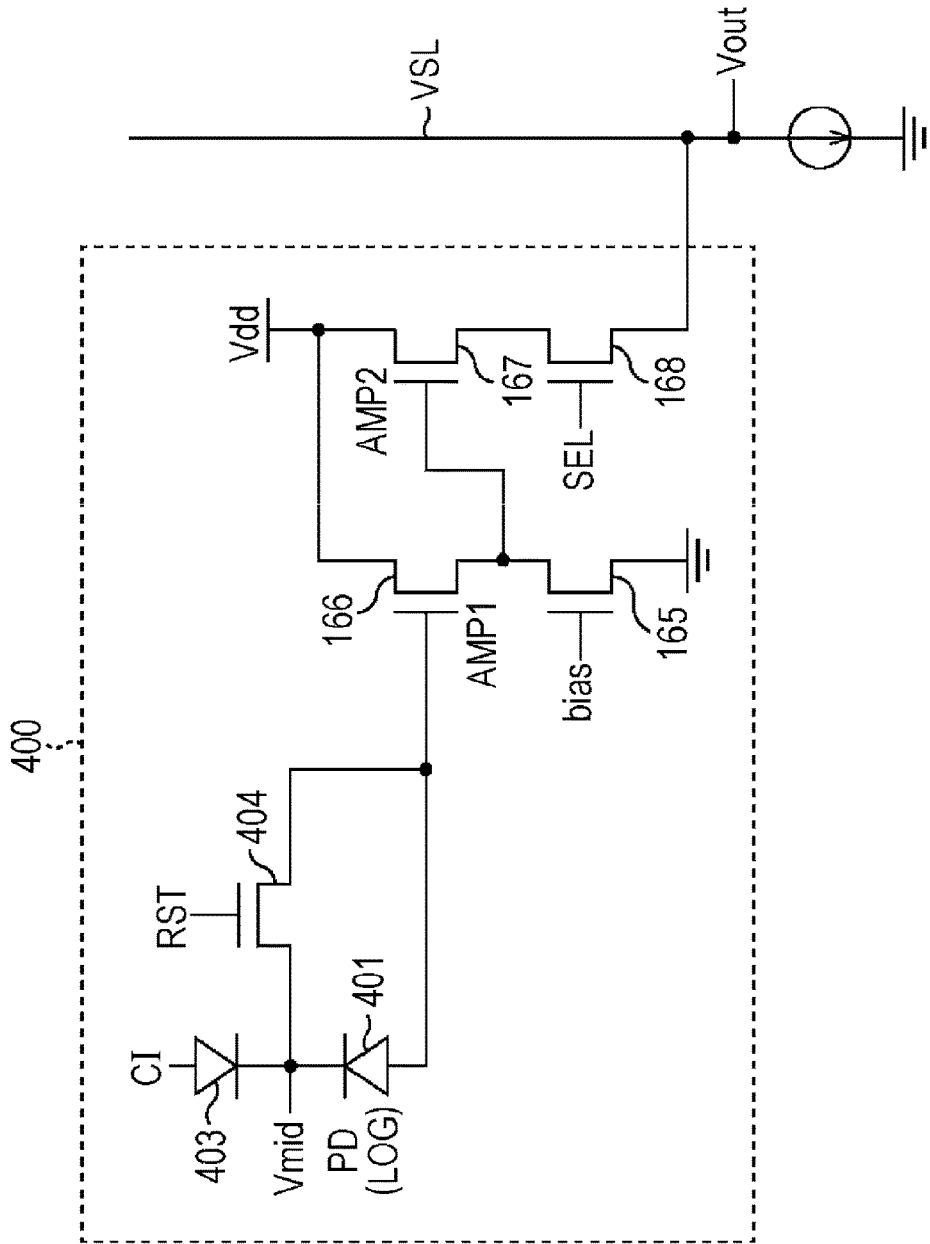
FIG. 12 is a diagram showing the circuit configuration of the logarithmic pixel according to the second embodiment.

FIG. 11 shows an example structure of the logarithmic pixel according to the second embodiment, and FIG. 12 shows a circuit configuration thereof. In the description below, the components having the same functions as those of the logarithmic pixel 200 shown in FIGS. 5 and 6 are denoted by the same reference numerals as those used in FIGS. 5 and 6, and explanation of them is not provided herein.

The logarithmic pixel 400 shown in FIGS. 11 and 12 has a region for charging a photodiode 401. The photodiode 401 can be a surface-type photodiode in which a p-type layer 401-1 is formed at the substrate surface side of an n-type well layer 401-2, for example, as in the logarithmic pixel 200. An $n^+$-region 402 that forms part of the photodiode 401 and is used as a well tap is also provided.

In the logarithmic pixel 400, a $p^+$-region 403 is further provided in the n-type layer 401-2, and this $p^+$-region 403 is connected to a signal line CI that supplies a potential VDD.

As described above, the logarithmic pixel 400 is designed to have a structure in which a P-type region is formed in a position that is located in the N-type region of the photodiode 401 but is at a distance from the P-type region of the photodiode 401, the signal line for supplying charge at a time of charging is connected to the P-type region, and charge is injected into the capacitance through the signal line.

Figure 13:
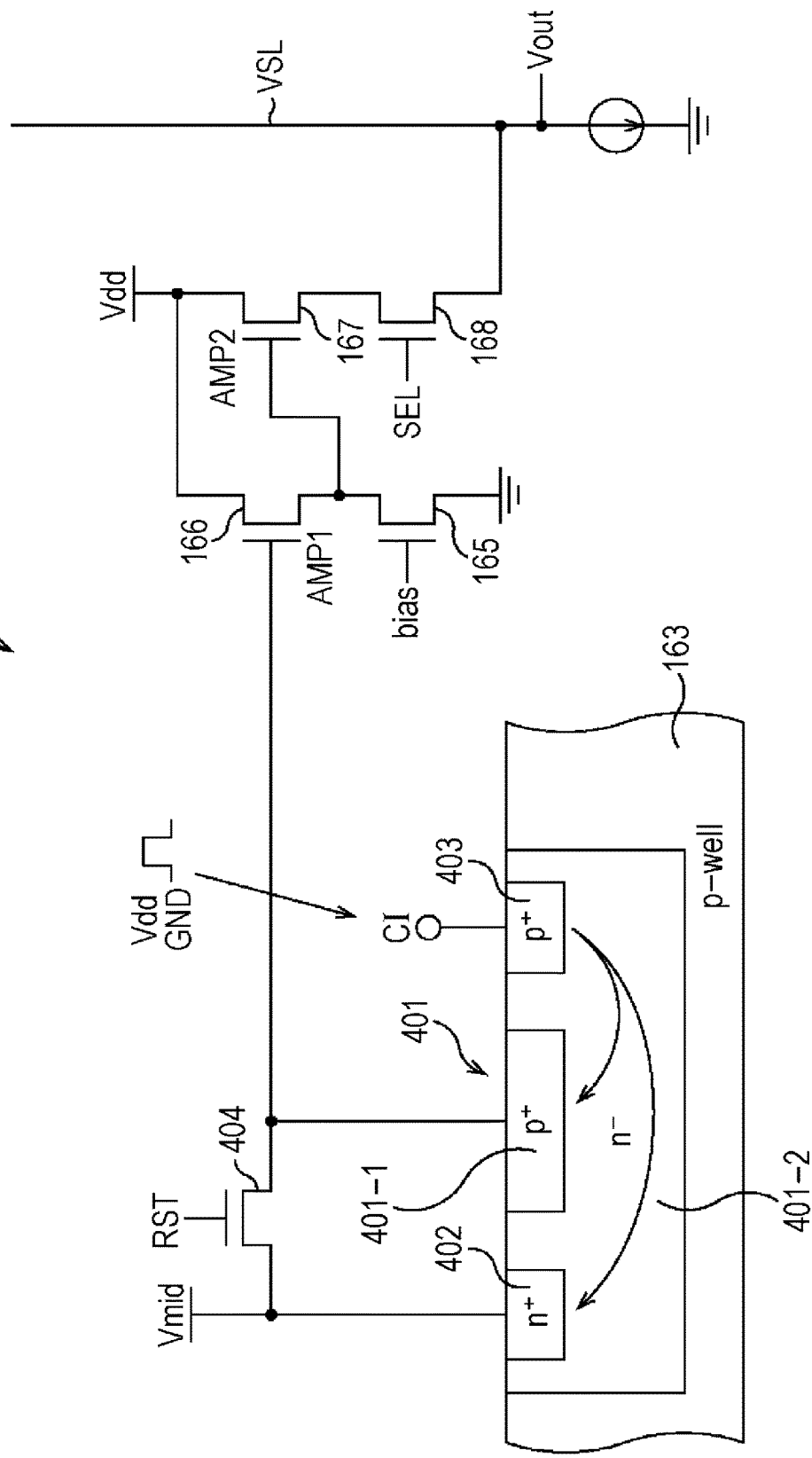
FIG. 13 is a diagram for explaining charging of the logarithmic pixel according to the second embodiment.

In the logarithmic pixel 400, charge is injected in a forward-biased direction, the charge is injected from a power supply Vdd, and the region into which the charge is injected (the charge to be charged) is the $p^+$-region 401-1. As the voltage of the potential Vdd is applied to the $p^+$-region 403, a current flows from the $p^+$-region 403 to the $n^+$-region 402, as shown in FIG. 13. At this point, holes also flow into the $p^+$-region 401-1 forming the photodiode 401, and is thus charged.

Figure 14:
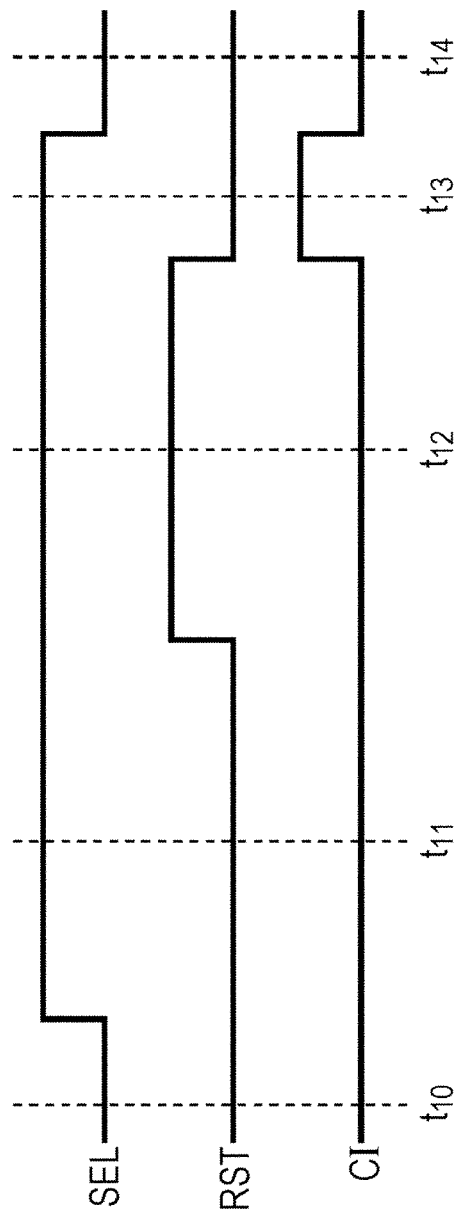
FIG. 14 is a timing chart for explaining operation of logarithmic pixels according to the second and fourth embodiments.

Referring now to the timing chart shown in FIG. 14, a method of driving the logarithmic pixel 400 is described. In the state at time t10, exposure is being conducted, and the voltage corresponding to the incident light intensity is generated in the photodiode 401.

In the state at time t11, a select signal SEL="Hi", and the voltage that is at a signal level and is generated at the cathode of the photodiode 401 is read out as a noise/signal component signal to the column processing unit 43 (FIG. 1).

In the state at time t12, a reset signal RST="Hi", a reset transistor 404 and a select transistor 168 are switched on, the voltage at the cathode of the photodiode 401 drops from the signal level to the reset level, and the reset level is read out as a noise component signal to the column processing unit 43.

In the state at time t13, the reset signal RST="Lo", and the reset transistor 404 is returned to the off-state. When the reset transistor 404 is returned to the off-state, the signal line CI is boosted to the potential Vdd. In this state, a current flows from the $p^+$-region 403 to the $n^+$-region 402, and part of the current also flows into the $p^+$-region 401-1, so that the $p^+$-region 401-1 is charged with holes.

At time t14, the select signal SEL="Lo", and the select transistor 168 is returned to the off-state. The potential of the signal line CI is also lowered to the ground (GND).

As the photodiode 401 is charged after reset as described above, the storage time for the next read operation can be shortened. As the storage time is shortened, the frame rate can be increased.

<Structure of a Logarithmic Pixel According to a Third Embodiment>

Next, a logarithmic pixel according to a third embodiment is described. A logarithmic pixel 500 according to the third embodiment has a function to charge the photodiode, like the logarithmic pixel 300 according to the first embodiment.

Figure 15:
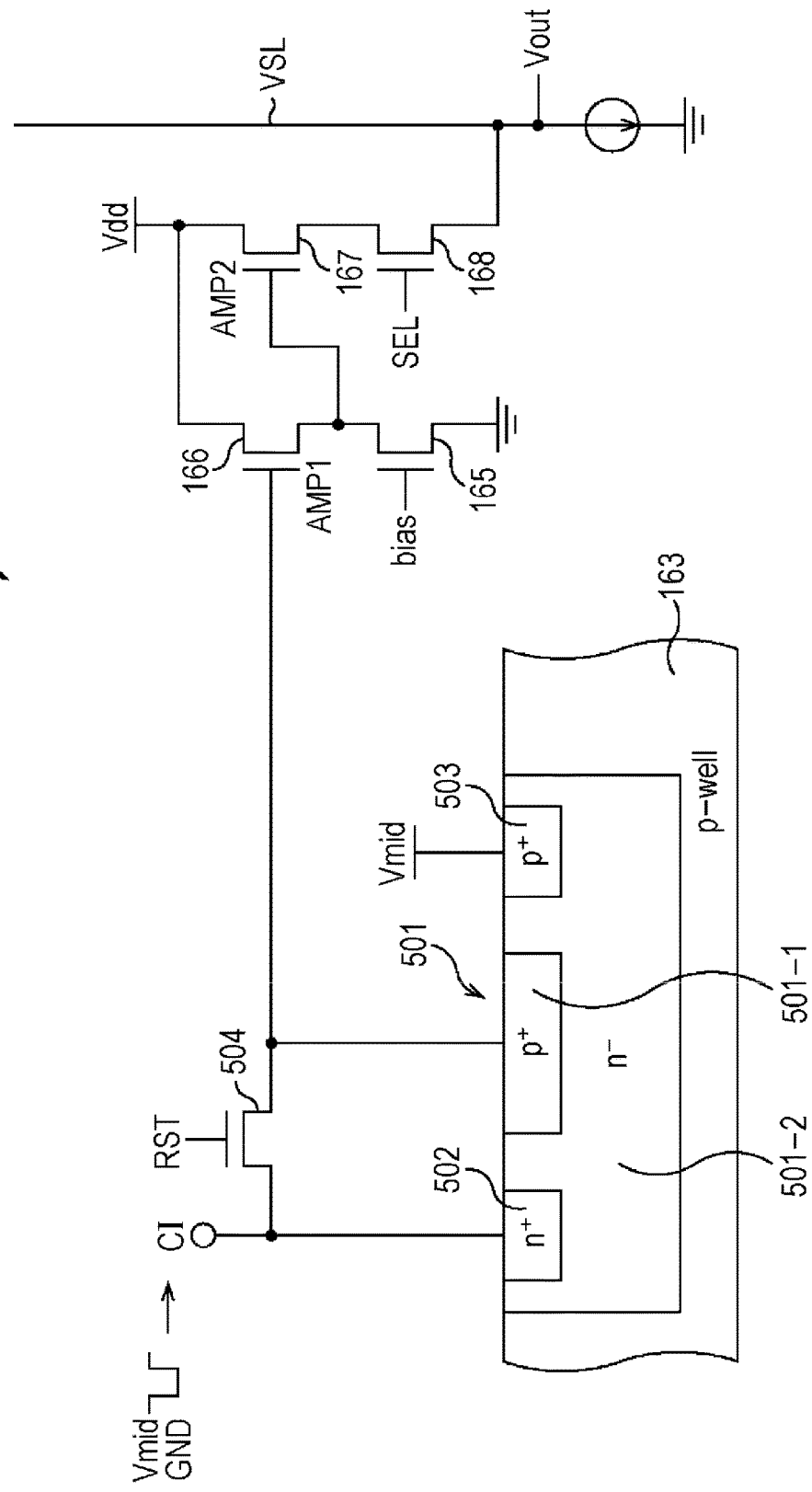
FIG. 15 is a diagram showing the structure of a logarithmic pixel according to a third embodiment.
Figure 16:
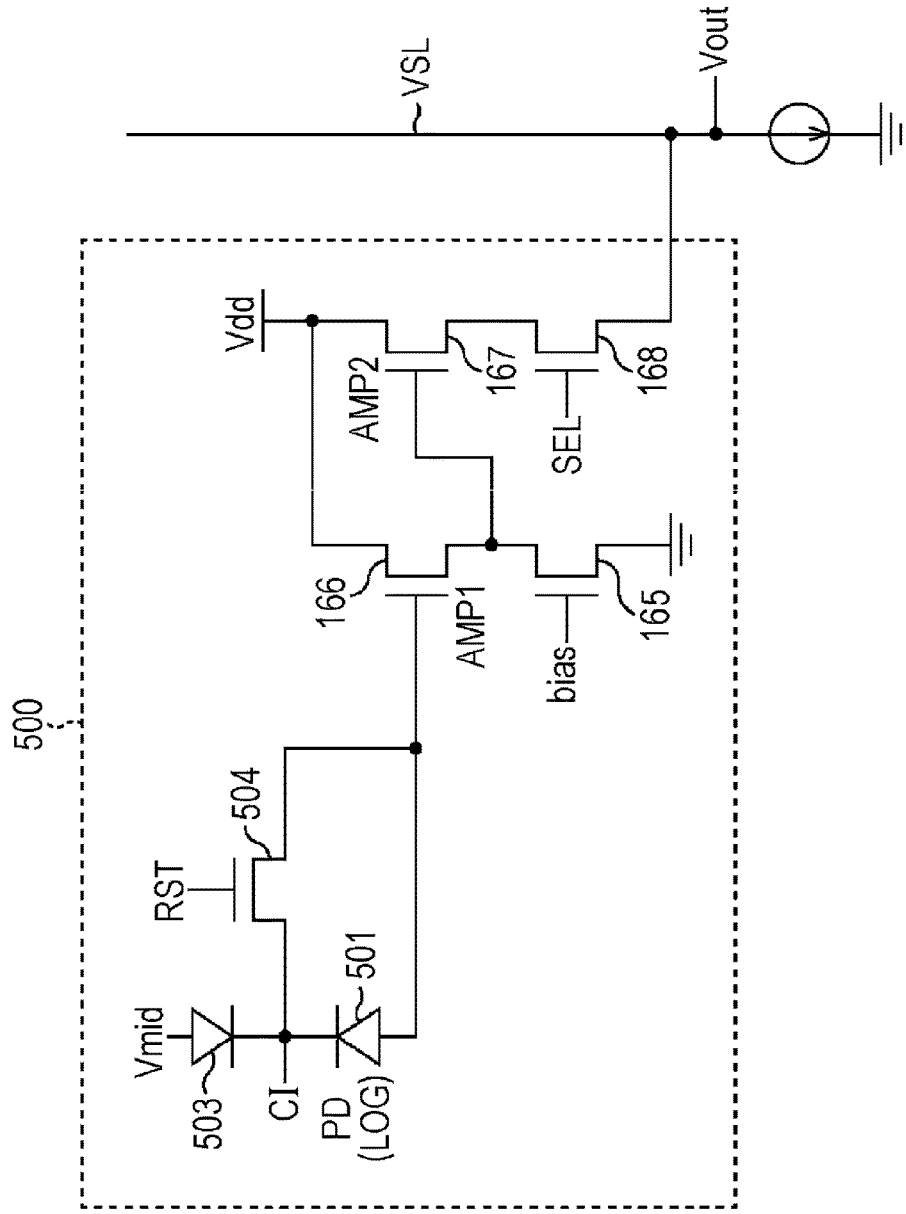
FIG. 16 is a diagram showing the circuit configuration of the logarithmic pixel according to the third embodiment.

FIG. 15 shows an example structure of the logarithmic pixel according to the third embodiment, and FIG. 16 shows a circuit configuration thereof. In the description below, the components having the same functions as those of the logarithmic pixel 200 shown in FIG. 5 are denoted by the same reference numerals as those used in FIG. 5, and explanation of them is not provided herein.

The logarithmic pixel 500 shown in FIGS. 15 and 16 has the same structure as the logarithmic pixel 400 shown in FIG. 11, but has a different voltage to be supplied. An $n^+$-region 502 forming the photodiode 501 of the logarithmic pixel 500 is connected to a signal line CI, and has a potential Vmid applied thereto. A $p^+$-region 503 provided in an n-type layer 501-2 has a potential Vmid applied thereto.

In the logarithmic pixel 500, charge is injected in a forward-biased direction, the charge is injected from a power supply Vmid, and the region into which the charge is injected is a $p^+$-region 501-1, as in the logarithmic pixel 400 shown in FIG. 11.

As described above, the logarithmic pixel 500 is designed to have a structure in which a P-type region is formed in a position that is located in the N-type region of the photodiode 501 but is at a distance from the P-type region of the photodiode 501, the potential supply line for supplying a midpoint potential Vmid is connected to the P-type region, an N-type region is formed in a position at a distance from the P-type region of the photodiode 501, the potential supply line for supplying charge at a time of charging is connected to the N-type region, and a potential is supplied to the capacitance through the potential supply line.

The voltage of the potential Vmid is applied to the $p^+$-region 503, and the voltage of the ground (GND) is applied to the $n^+$-region 502 (grounded). Accordingly, as in the logarithmic pixel 400 shown in FIG. 11, a current also flows from the $p^+$-region 503 (equivalent to the portion indicated as the $p^+$-region 403 in FIG. 13) to the $n^+$-region 502 (equivalent to the portion indicated as the $n^+$-region 402 in FIG. 13) as shown in FIG. 13 in the logarithmic pixel 500.

At this point, holes also flow into the $p^+$-region 501-1 forming the photodiode 501, and the $p^+$-region 501-1 is thus charged.

Figure 17:
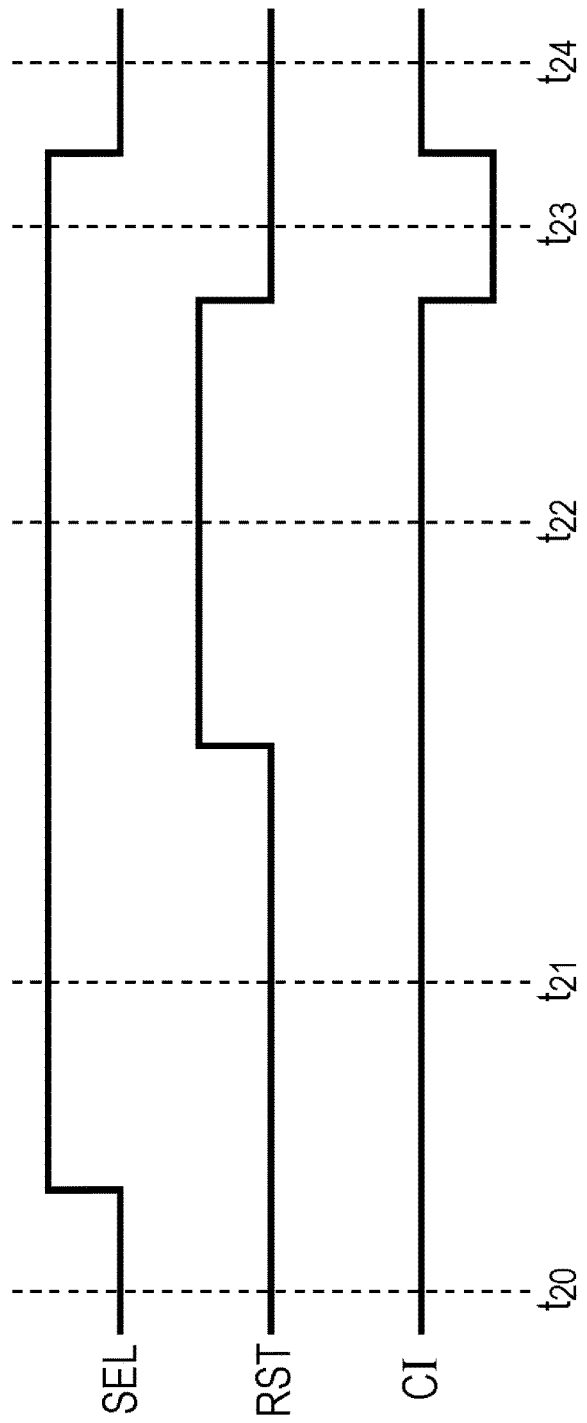
FIG. 17 is a timing chart for explaining operation of the logarithmic pixel according to the third embodiment.

Referring now to the timing chart shown in FIG. 17, a method of driving the logarithmic pixel 500 is described. The states at times t20 through t22 are the same as those at times t10 through t12 shown in FIG. 14, and therefore, explanation of them is not provided herein.

In the state at time t23, a reset signal RST="Lo", and a reset transistor 504 is returned to the off-state. When the reset transistor 504 is returned to the off-state, the signal line CI is stepped down to the potential GND (the midpoint potential Vmid of the signal line CI is also turned off). In this state, a current flows from the $p^+$-region 503 to the $n^+$-region 502, and part of the current also flows into the $p^+$-region 501-1, so that the $p^+$-region 501-1 is charged with holes, as described above.

As described above, in the logarithmic pixel 500, only for a predetermined period of time after the reset transistor 504 performs a reset operation, the potential to be applied to the $n^+$-region 502 is lowered to 0 (grounded) (or the supply of the midpoint potential Vmid is suspended). In this manner, the capacitance derived from the PN junction of the logarithmic pixel 500 is charged.

At time t24, a select signal SEL="Lo", and the select transistor 168 is returned to the off-state. The potential of the signal line CI is returned to the potential Vmid.

As the photodiode 501 is charged after reset as described above, the storage time for the next read operation can be shortened. As the storage time is shortened, the frame rate can be increased.

<Structure of a Logarithmic Pixel According to a Fourth Embodiment>

Next, a logarithmic pixel according to a fourth embodiment is described. A logarithmic pixel 600 according to the fourth embodiment has a function to charge the photodiode, like the logarithmic pixel 300 according to the first embodiment.

Figure 18:
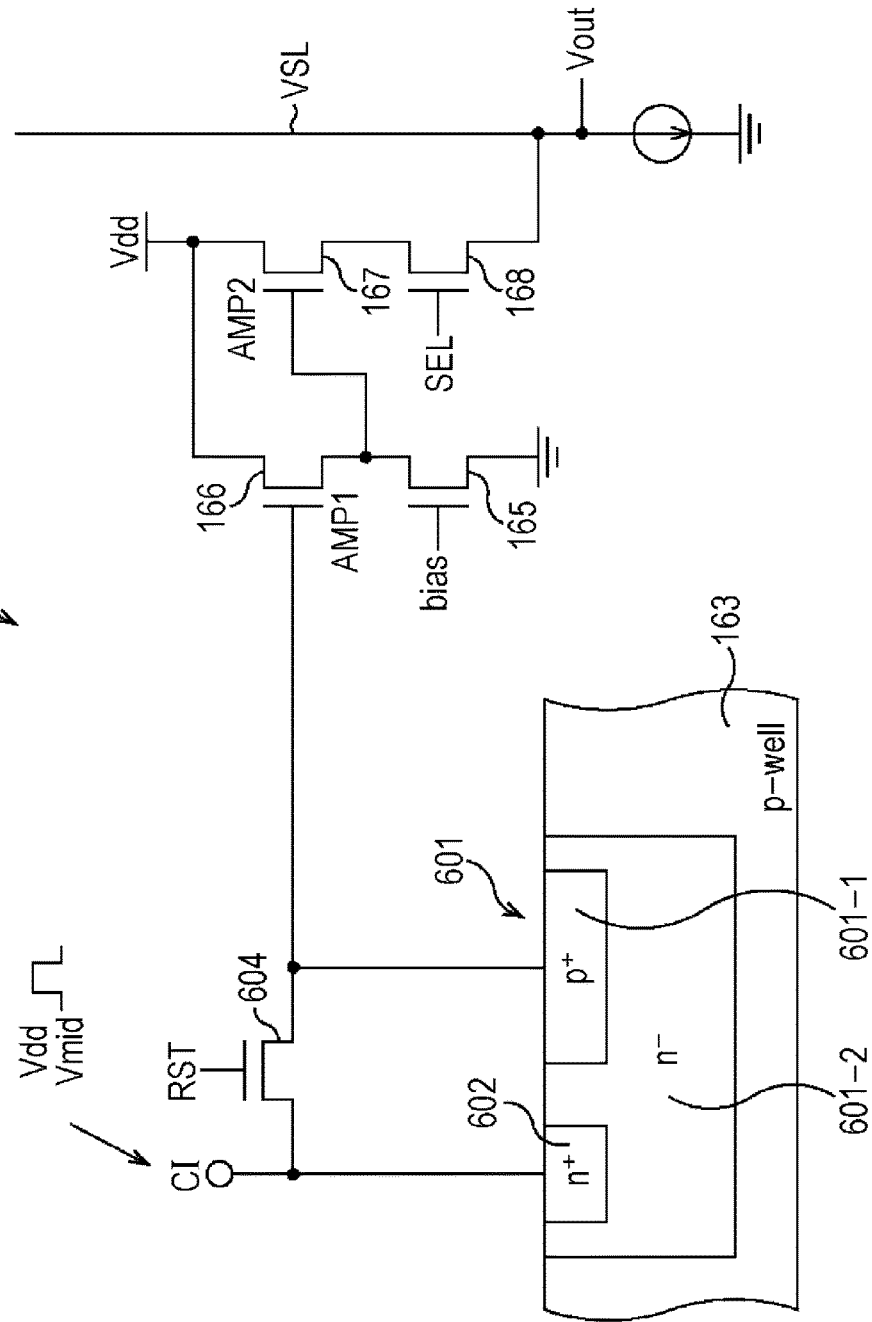
FIG. 18 is a diagram showing the structure of a logarithmic pixel according to a fourth embodiment.
Figure 19:
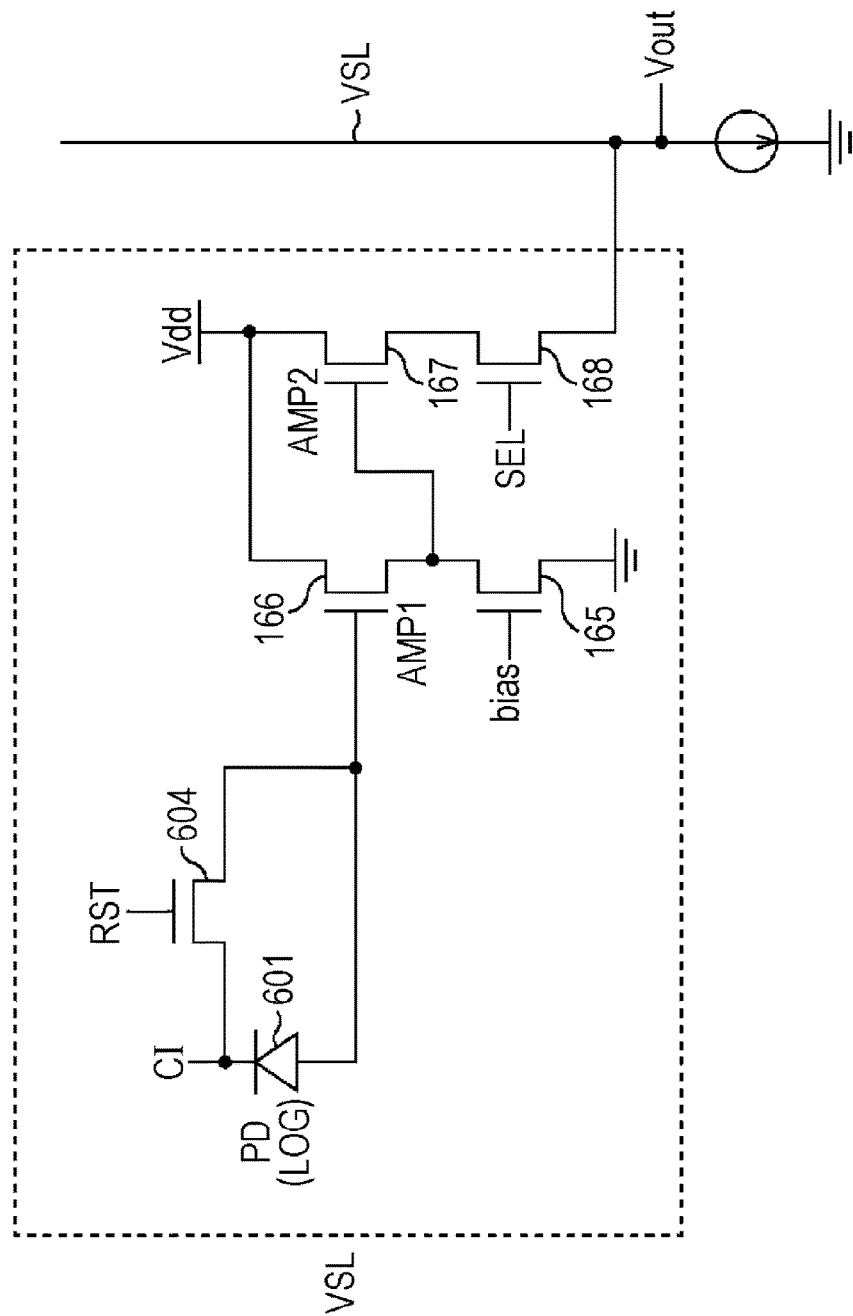
FIG. 19 is a diagram showing the circuit configuration of the logarithmic pixel according to the fourth embodiment.

FIG. 18 shows an example structure of the logarithmic pixel according to the fourth embodiment, and FIG. 19 shows a circuit configuration thereof. In the description below, the components having the same functions as those of the logarithmic pixel 200 shown in FIG. 5 are denoted by the same reference numerals as those used in FIG. 5, and explanation of them is not provided herein.

The logarithmic pixel 600 shown in FIG. 18 has the same structure as the logarithmic pixel 300 shown in FIG. 9, but has a different voltage to be supplied to a photodiode 601. A signal line CI is connected to an $n^+$-region 602 forming the photodiode 601 of the logarithmic pixel 600, and has a potential Vdd or a potential Vmid applied thereto.

The potential Vdd is applied to the $n^+$-region 602 when the signal line CI is in the onstate, and the potential Vmid (midpoint potential) is applied to the $n^+$-region 602 when the signal line CI is in the off-state. The logarithmic pixel 600 shown in FIG. 18 is designed to have a structure in which charge is injected in an inversely-biased direction into the photodiode 601.

In the logarithmic pixel 600, a p-well layer 163 and the gate of a first amplifier transistor 166 are capacitively-coupled so that a bias can be applied even when a reset transistor 604 is switched off.

As described above, the logarithmic pixel 600 is designed to have a structure in which the signal line for supplying the midpoint potential Vmid or the potential Vdd is connected to the photodiode 601, and charge is injected into the capacitance through the signal line.

Referring again to the timing chart shown in FIG. 14, a method of driving the logarithmic pixel 600 is described. In the state at time t10, exposure is being conducted, and the voltage corresponding to the incident light intensity is generated in the photodiode 601.

In the state at time t11, a select signal SEL="Hi", and the voltage that is at a signal level and is generated at the cathode of the photodiode 601 is read out as a noise/signal component signal to the column processing unit 43 (FIG. 1).

In the state at time t12, a reset signal RST="Hi", the reset transistor 604 and a select transistor 168 are switched on, the voltage at the cathode of the photodiode 601 drops from the signal level to the reset level, and the reset level is read out as a noise component signal to the column processing unit 43.

In the state at time t13, the reset signal RST="Lo", and the reset transistor 604 is returned to the off-state. When the reset transistor 604 is returned to the off-state, the signal line CI is boosted from the potential Vmid to the potential Vdd.

At time t14, the select signal SEL="Lo", and the select transistor 168 is returned to the off-state. The potential of the signal line CI is also lowered to the potential Vmid.

As the photodiode 401 is charged after reset as described above, the storage time for the next read operation can be shortened. As the storage time is shortened, the frame rate can be increased.

The logarithmic pixel 300 according to the first embodiment, the logarithmic pixel 400 according to the second embodiment, the logarithmic pixel 500 according to the third embodiment, and the logarithmic pixel 600 according to the fourth embodiment each have a two-stage amplification structure formed with the first amplifier transistor 166 and the second amplifier transistor 167, for example.

Figure 20:
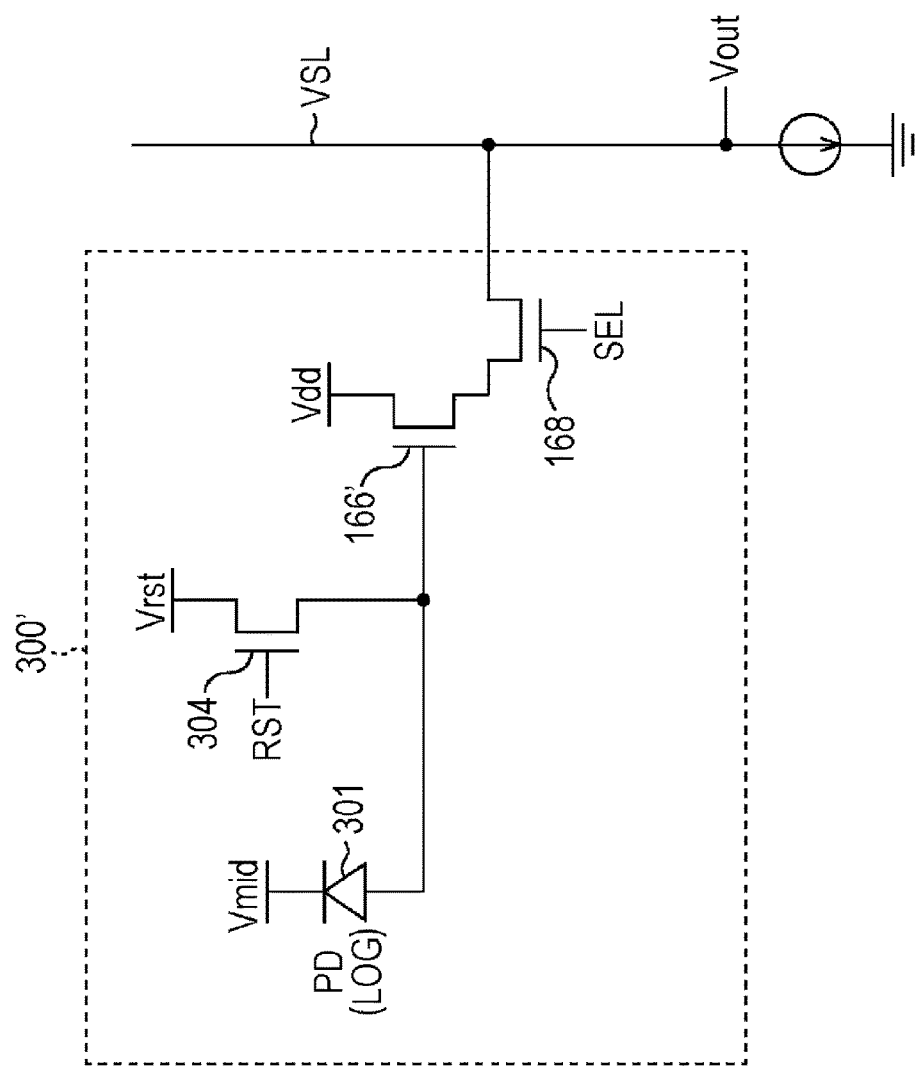
FIG. 20 is a diagram showing the structure of a logarithmic pixel of a one-stage amplification case.

A logarithmic pixel does not necessarily have a two-stage amplification structure, but may have a one-stage amplification structure as shown in FIG. 20, for example. The logarithmic pixel 300' shown in FIG. 20 is a logarithmic pixel that is the same as the logarithmic pixel 300 shown in FIG. 10, except for having a one-stage amplification structure.

Having a one-stage amplification structure, the logarithmic pixel 300' includes an amplifier transistor 166', with the second amplifier transistor 167 (FIG. 10) removed therefrom.

Such a one-stage amplification structure can also be applied to the logarithmic pixel 400 according to the second embodiment, the logarithmic pixel 500 according to the third embodiment, and the logarithmic pixel 600 according to the fourth embodiment. That is, a logarithmic pixel to which the present technology is applied may have a one-stage amplification structure, or may have a two-stage amplification structure.

<Measures against Blooming>

As described above, in a logarithmic pixel (that will be hereinafter described as the logarithmic pixel 300, for example) to which the present technology is applied, the time until the logarithmic region starts can be shortened. In a case where the logarithmic pixel 300 and a pixel of a storage-type CMOS, such as the linear pixel 100 shown in FIG. 2, are arranged adjacent to each other (arranged in a space-sharing manner), there is a possibility that one of the pixels adversely affects the characteristics of the other due to blooming.

More specifically, in the logarithmic pixel 300, the carriers can typically be in a blooming state. If the linear pixel 100 is placed in the vicinity of such a logarithmic pixel 300, there is a possibility that blooming of the logarithmic pixel 300 damages a signal of the linear pixel 100.

Therefore, in a case where the logarithmic pixel 300 and the linear pixel 100 are arranged adjacent to each other, the two pixels are made to handle different carriers from each other.

Figure 21:
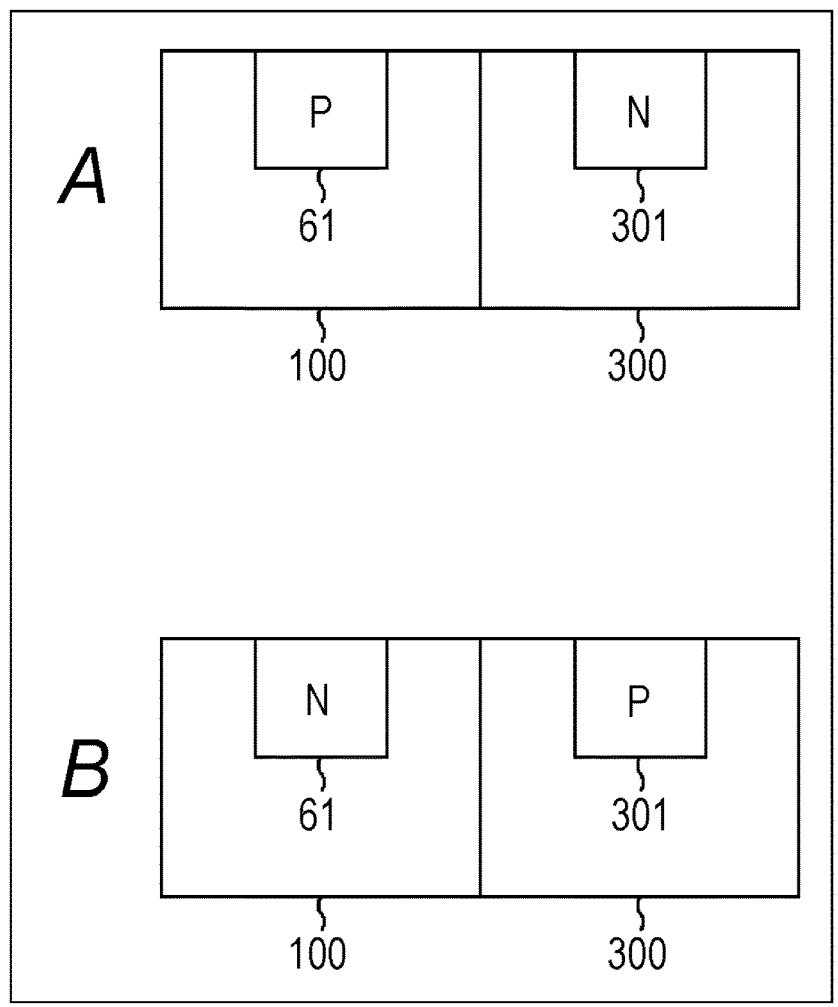
FIG. 21 is a diagram for explaining measures against blooming.

As shown in FIG. 21A, in a case where the carrier to be handled by the linear pixel 100 is holes, the carrier to be handled by the logarithmic pixel 300 is electrons, for example.

As shown in FIG. 21B, in a case where the carrier to be handled by the linear pixel 100 is electrons, the carrier to be handled by the logarithmic pixel 300 is holes, for example.

The photodiode 61 (or 301) is formed with an n-region and a p-region, as described above. In other words, a photodiode is formed with a first semiconductor region and a second semiconductor region, and the first semiconductor region and the second semi-conductor region are of different conductivity types from each other.

In a case where the logarithmic pixel 300 and the linear pixel 100 are designed to handle different carriers from each other, the following structure can be constructed, for example. Where the first semiconductor region of the photodiode 61 of the linear pixel 100 is of the P-type, the second semiconductor region is of the N-type, which is the opposite of the conductivity type of the first semiconductor region. In a case where the photodiode 61 of the linear pixel 100 is formed in this manner, a third semi-conductor region equivalent to the first semiconductor region of the photodiode 301 of the logarithmic pixel 300 is of the N-type, and a fourth semiconductor region equivalent to the second semiconductor region is of the P-type.

Where the first semiconductor region of the photodiode 61 of the linear pixel 100 is of the N-type, for example, the second semiconductor region is of the P-type, which is the opposite of the conductivity type of the first semiconductor region. In a case where the photodiode 61 of the linear pixel 100 is formed in this manner, the third semi-conductor region of the photodiode 301 of the logarithmic pixel 300 is of the P-type, and the fourth semiconductor region is of the N-type.

As described above, the first semiconductor region included in the photodiode 61 of the linear pixel 100 and the first semiconductor region included in the photodiode 301 of the logarithmic pixel 300 are formed to have an opposite-conductivity relationship.

In a case where the logarithmic pixel 300 and the linear pixel 100 are arranged adjacent to each other in the above manner, the two pixels are made to handle different carriers from each other, so that blooming of the logarithmic pixel 300 can be prevented from damaging a signal of the linear pixel 100.

As described above, according to the present technology, even in a case where a logarithmic pixel in a solar cell mode and a linear pixel (storage-type CMOS image sensor) are combined in a space-sharing manner, there is no possibility that blooming adversely affects each other's imaging characteristics.

Also, according to the present technology, in a logarithmic pixel, the time until the logarithmic region starts can be shortened, and there is no need to sacrifice the frame rate of a storage-type CMOS image sensor (linear pixel). Accordingly, in an imaging apparatus using logarithmic pixels and linear pixels, an imaging process with an improved frame rate can be performed.

<Structure of an Electronic Apparatus>

An imaging element formed with the above described logarithmic pixels and linear pixels can be generally used in an imaging apparatus such as a digital still camera or a video camera, a portable terminal device having an imaging function such as a portable telephone device, a copying machine using an imaging apparatus as the image reading unit, and an electronic apparatus using an imaging element as the image capturing unit (photoelectric conversion unit).

Figure 22:
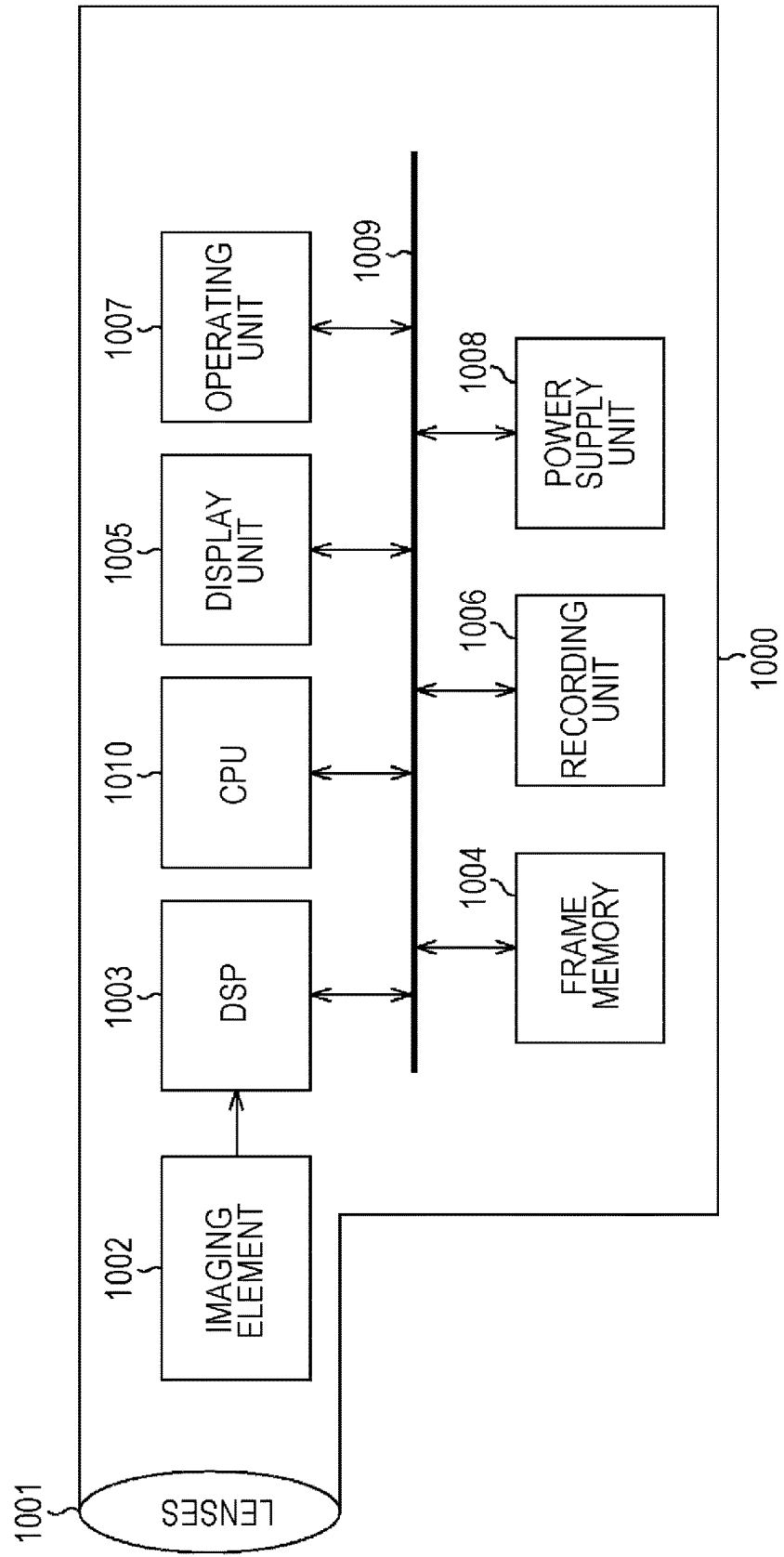
FIG. 22 is a diagram for explaining an electronic apparatus.

FIG. 22 is a block diagram showing an example structure of an electronic apparatus according to the present technology, such as an imaging apparatus. As shown in FIG. 22, an imaging apparatus 1000 according to the present technology includes an optical system including lenses 1001 and the like, an imaging element (imaging device) 1002, a DSP circuit 1003, a frame memory 1004, a display device 1005, a recording device 1006, an operating system 1007, a power supply system 1008, and the like. The DSP circuit 1003, the frame memory 1004, the display device 1005, the recording device 1006, the operating system 1007, and the power supply system 1008 are connected to one another via a bus line 1009.

The lenses 1001 capture incident light (image light) from an object, and form an image on the imaging surface of the imaging element 1002. The imaging element 1002 converts the amount of the incident light formed as an image on the imaging surface by the lenses 1001 into an electrical signal on a pixel-by-pixel basis, and outputs the electrical signal as a pixel signal.

The display device 1005 is formed with a panel-type display device such as a liquid crystal display device or an organic EL (Electro Luminescence) display device, and displays a moving image or a still image taken by the imaging element 1002. The recording device 1006 records a moving image or a still image taken by the imaging element 1002 on a recording medium such as a DVD (Digital Versatile Disk) or an HDD (Hard Disk Drive).

The operating system 1007 is operated by a user, and issues operation instructions related to various functions of this imaging apparatus. The power supply system 1008 supplies various kinds of power sources as the operation power supplies to the DSP circuit 1003, the frame memory 1004, the display device 1005, the recording device 1006, and the operating system 1007, as appropriate.

The imaging apparatus having the above structure can be used as an imaging apparatus such as a video camera or a digital still camera, or even can be used as a camera module for mobile devices such as a portable telephone device. In this imaging apparatus, the above described logarithmic pixel and linear pixel can be used as the imaging element 1002.

<Examples of Application of an Imaging Apparatus>

Figure 23:
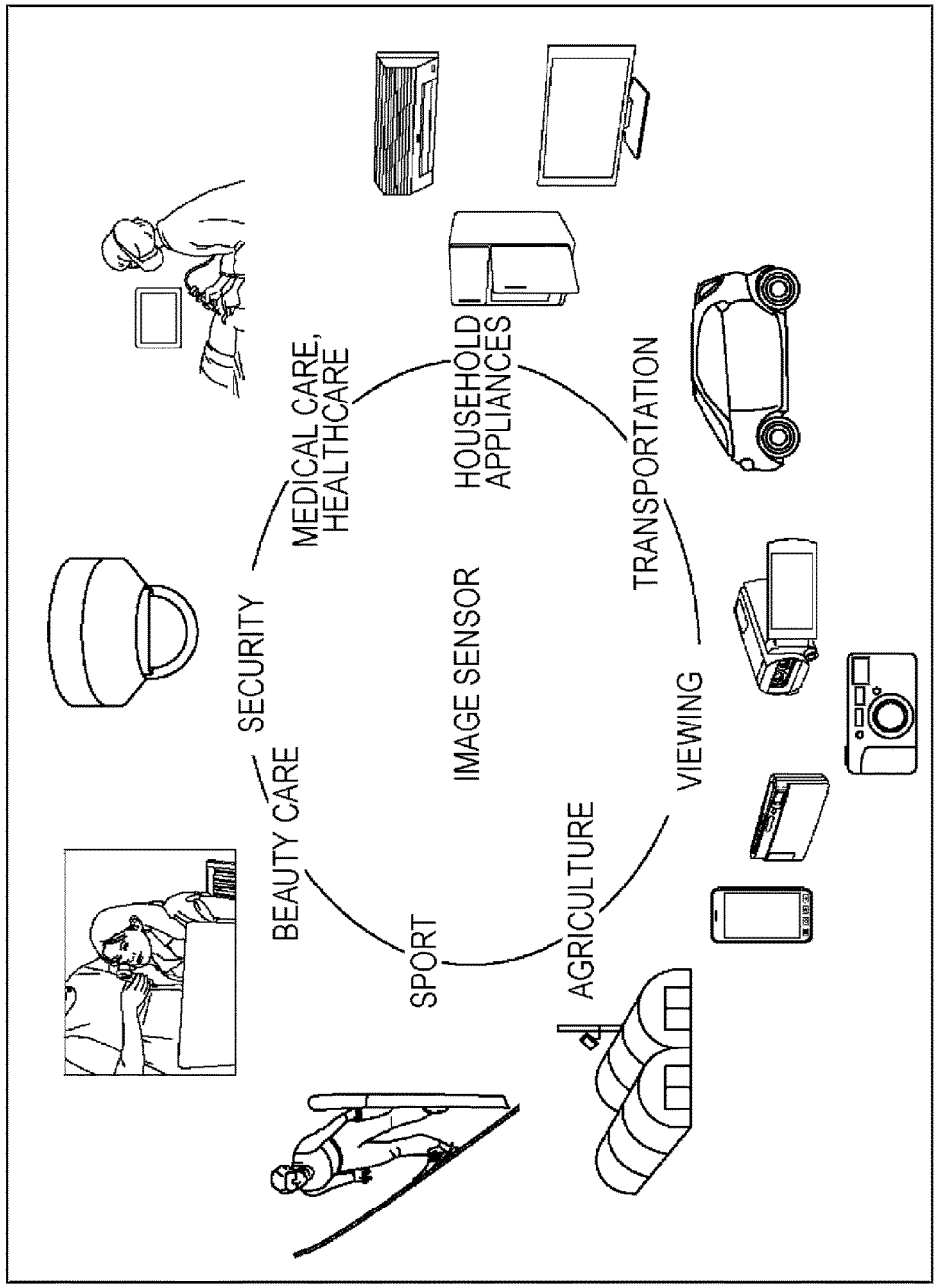
FIG. 23 is a diagram for explaining examples of application.

FIG. 23 is a diagram showing examples of the application of an imaging element formed with the above described logarithmic pixel and linear pixel, and an electronic apparatus including the imaging element.

The above described imaging element can be used in various cases where light such as visible light, infrared light, ultraviolet light, or X-rays is sensed, as described below, for example.

An apparatus that takes an image to be viewed: such as a digital camera or a portable telephone device with a camera function An apparatus for traffic: such as an in-vehicle sensor that takes images of the back side, the front side, the surroundings, and the inside of a car so as to recognize the condition of the driver and the like, a surveillance camera that surveys running vehicles and a street, or a distance measuring sensor that measures distances between vehicles or the like An apparatus to be used as a household appliance that takes an image of a gesture of a user and performs a machine operation in accordance with the gesture: such as a television receiver, a refrigerator, or an air conditioner An apparatus for medical care or healthcare: such as an endoscope, or an apparatus that takes an image of blood vessels by receiving infrared light An apparatus for security purposes: such as an anti-crime surveillance camera or a camera for individual verification An apparatus for beauty care: such as a skin measurer that takes an image of the skin, or a microscope that takes an image of the scalp An apparatus for sports: such as an action camera or a wearable camera for sporting use An apparatus for agriculture: such as a camera for monitoring a field and the conditions of products In this specification, a "system" means an entire apparatus formed with more than one device.

The effects disclosed in this specification are merely examples and do not limit the present technology, and there may be some other effects.

It should be noted that embodiments of the present technology are not limited to the above described embodiments, and various changes may be made to them without departing from the scope of the technology.

The present technology may also be embodied in the structures described below.

(1)

An imaging apparatus with logarithmic characteristics, including:

a photodiode configured to receive light;

a well tap unit configured to fix a potential of a first semiconductor region of the photodiode; and a resetting unit configured to reset the photodiode, wherein a second semiconductor region of the photodiode outputs a voltage signal equivalent to a photocurrent subjected to logarithmic compression.

(2)

The imaging apparatus according to (1), wherein a first potential to be supplied to the well tap unit is made lower than a second potential to be supplied to the resetting unit, to charge a capacitance generated at the photodiode when the resetting unit performs a reset operation.

(3)

The imaging apparatus according to (1), further including a charging unit for the second semiconductor region of the photodiode, the charging unit being formed in a position at a distance from the second semiconductor region, wherein a signal line for supplying charge is connected to the charging unit.

(4)

The imaging apparatus according to (3), wherein a capacitance generated at the photodiode is charged by applying a predetermined potential after the resetting unit performs a reset operation.

(5)

The imaging apparatus according to (3), wherein a signal line for supplying a midpoint potential is connected to each of the charging unit and the well tap unit.

(6)

The imaging apparatus according to (5), wherein the well tap unit charges the capacitance generated at the photodiode, by cutting off the midpoint potential to the first semiconductor region for a predetermined time after the reset operation performed by the resetting unit.

(7)

The imaging apparatus according to (1), wherein a signal line is connected to the well tap unit, the signal line supplying a first potential when the resetting unit performs a reset operation, the signal line supplying a second potential when the resetting unit is not performing a reset operation.

(8)

The imaging apparatus according to any of (1) to (7), wherein an output from the photodiode is subjected to two-stage amplification.

(9)

The imaging apparatus according to any of (1) to (7), wherein an output from the photodiode is subjected to one-stage amplification.

(10)

The imaging apparatus according to any of (1) to (9), wherein, when located adjacent to a photodiode having linear characteristics, the photodiode handles a different carrier from a carrier being handled by the photodiode having linear characteristics.

(11)

An imaging apparatus including:
a first photodiode having linear characteristics, the first photodiode including a first semiconductor region and a second semiconductor region, a conductivity type of the second semiconductor region being the opposite of a conductivity type of the first semiconductor region; and
a second photodiode having logarithmic characteristics, the second photodiode including a third semiconductor region and a fourth semiconductor region, a conductivity type of the fourth semiconductor region being the opposite of a conductivity type of the third semiconductor region,
wherein
the first photodiode and the second photodiode are arranged in a space-sharing manner, and
the conductivity type of the first semiconductor region is the opposite of the conductivity type of the third semiconductor region.

(12)

A drive method for an imaging apparatus with logarithmic characteristics, the imaging apparatus including:
a photodiode configured to receive light;
a well tap unit configured to fix a potential of a first semiconductor region of the photodiode; and
a resetting unit configured to reset the photodiode,
the drive method including
charging a capacitance generated at the photodiode by applying a lower potential than a potential to be supplied to the resetting unit, when the resetting unit performs a reset operation.

(13)

A drive method for an imaging apparatus with logarithmic characteristics, the imaging apparatus including:
a photodiode configured to receive light;
a well tap unit configured to fix a potential of a first semiconductor region of the photodiode; and
a resetting unit configured to reset the photodiode,
the drive method including
charging a capacitance generated at the photodiode by applying a predetermined potential to a charging unit for a second semiconductor region forming the photodiode after the resetting unit performs a reset operation, the charging unit being formed in a position at a distance from the second semiconductor region.

(14)

A drive method for an imaging apparatus with logarithmic characteristics,
the imaging apparatus including:
a photodiode configured to receive light;
a well tap unit configured to fix a potential of a first semiconductor region of the photodiode; and
a resetting unit configured to reset the photodiode,
the drive method including
supplying a midpoint potential to a charging unit for a second semiconductor region forming the photodiode, supplying the midpoint potential to the first semiconductor region formed in a position at a distance from the second semiconductor region forming the photodiode except for a predetermined time after a reset operation, and cutting off the midpoint potential for the predetermined time after a reset operation, the charging unit being formed in a position at a distance from the second semiconductor region.

(15)

A drive method for an imaging apparatus with logarithmic characteristics, the imaging apparatus including:
a photodiode configured to receive light;
a well tap unit configured to fix a potential of a first semiconductor region of the photodiode; and
a resetting unit configured to reset the photodiode,
the drive method including
supplying a first potential to the first semiconductor region forming the photodiode when the resetting unit performs a reset operation, and supplying a second potential to the first semiconductor region when the resetting unit is not performing a reset operation.

(16)

An electronic apparatus including an imaging apparatus with logarithmic characteristics,
the imaging apparatus including:
a photodiode configured to receive light;
a well tap unit configured to fix a potential of a first semiconductor region of the photodiode; and
a resetting unit configured to reset the photodiode,
a second semiconductor region of the photodiode outputting a voltage signal equivalent to a photocurrent subjected to logarithmic compression; and a signal processing unit configured to perform signal processing on a signal output from the imaging apparatus.

(17)

An electronic apparatus including:
an imaging apparatus including:
a first photodiode having linear characteristics, the first photodiode including a first semiconductor region and a second semiconductor region, a conductivity type of the second semiconductor region being the opposite of a conductivity type of the first semiconductor region; and
a second photodiode having logarithmic characteristics, the second photodiode including a third semiconductor region and a fourth semiconductor region, a conductivity type of the fourth semiconductor region being the opposite of a conductivity type of the third semiconductor region,
the first photodiode and the second photodiode being arranged in a space-sharing manner, and
the conductivity type of the first semiconductor region being the opposite of the conductivity type of the third semiconductor region; and
a signal processing unit configured to perform signal processing on a signal output from the imaging apparatus.

It should be understood by those skilled in the art that various modifications, combinations, sub-combinations and alterations may occur depending on design requirements and other factors insofar as they are within the scope of the appended claims or the equivalents thereof.

REFERENCE SIGNS LIST

300 Logarithmic pixel
301 Photodiode
302 N$^+$-region
400 Logarithmic pixel
401 Photodiode
402 N$^+$-region
403 P$^+$-region
500 Logarithmic pixel
501 Photodiode
502 N$^+$-region
503 P$^+$-region
600 Logarithmic pixel
601 Photodiode
602 N$^+$-region

What is claimed is:

1. An imaging apparatus with logarithmic characteristics, comprising:
a photodiode configured to receive light;
a well tap unit configured to fix a potential of a first semiconductor region of the photodiode, the well tap unit comprising an n+ region of the photodiode;
a charging unit for a second semiconductor region of the photodiode, the charging unit being formed in a position at a distance from the second semiconductor region, wherein a signal line for supplying charge is connected to the charging unit; and
a resetting unit configured to reset the photodiode, the resetting unit comprising a transistor,
wherein the second semiconductor region of the photodiode outputs a voltage signal equivalent to a photocurrent subjected to logarithmic compression.

2. The imaging apparatus according to claim 1, wherein a first potential to be supplied to the well tap unit is made lower than a second potential to be supplied to the resetting unit, to charge a capacitance generated at the photodiode when the resetting unit performs a reset operation.

3. The imaging apparatus according to claim 1, wherein a capacitance generated at the photodiode is charged by applying a predetermined potential after the resetting unit performs a reset operation.

4. The imaging apparatus according to claim 1, wherein a signal line for supplying a midpoint potential is connected to each of the charging unit and the well tap unit.

5. The imaging apparatus according to claim 4, wherein the well tap unit charges the capacitance generated at the photodiode, by cutting off the midpoint potential to the first semiconductor region for a predetermined time after a reset operation performed by the resetting unit.

6. The imaging apparatus according to claim 1, wherein a signal line is connected to the well tap unit, the signal line supplying a first potential when the resetting unit performs a reset operation, the signal line supplying a second potential when the resetting unit is not performing a reset operation.

7. The imaging apparatus according to claim 1, wherein an output from the photodiode is subjected to two-stage amplification.

8. The imaging apparatus according to claim 1, wherein an output from the photodiode is subjected to one-stage amplification.

9. The imaging apparatus according to claim 1, wherein, when located adjacent to a photodiode having linear characteristics, the photodiode handles a different carrier from a carrier being handled by the photodiode having linear characteristics.

10. A drive method for an imaging apparatus with logarithmic characteristics,
the imaging apparatus including:
a photodiode configured to receive light;
a well tap unit configured to fix a potential of a first semiconductor region of the photodiode, the well tap unit comprising an n+ region of the photodiode; and
a resetting unit configured to reset the photodiode, the resetting unit comprising a transistor,
the drive method comprising
charging a capacitance generated at the photodiode by applying a lower potential than a potential to be supplied to the resetting unit, when the resetting unit performs a reset operation.

11. A drive method for an imaging apparatus with logarithmic characteristics,
the imaging apparatus including:
a photodiode configured to receive light;
a well tap unit configured to fix a potential of a first semiconductor region of the photodiode, the well tap unit comprising an n+ region of the photodiode; and
a resetting unit configured to reset the photodiode, the resetting unit comprising a transistor,
the drive method comprising
charging a capacitance generated at the photodiode by applying a predetermined potential to a charging unit for a second semiconductor region forming the photodiode after the resetting unit performs a reset operation, the charging unit being formed in a position at a distance from the second semiconductor region.

12. A drive method for an imaging apparatus with logarithmic characteristics,
the imaging apparatus including:
a photodiode configured to receive light;
a well tap unit configured to fix a potential of a first semiconductor region of the photodiode, the well tap unit comprising an n+ region of the photodiode; and
a resetting unit configured to reset the photodiode, the resetting unit comprising a transistor,
the drive method comprising
supplying a midpoint potential to a charging unit for a second semiconductor region forming the photodiode, supplying the midpoint potential to the first semiconductor region formed in a position at a distance from the second semiconductor region forming the photodiode except for a predetermined time after a reset operation, and cutting off the midpoint potential for the predetermined time after a reset operation, the charging unit being formed in a position at a distance from the second semiconductor region.

13. A drive method for an imaging apparatus with logarithmic characteristics,
the imaging apparatus including:
a photodiode configured to receive light;
a well tap unit configured to fix a potential of a first semiconductor region of the photodiode, the well tap unit comprising an n+ region of the photodiode; and
a resetting unit configured to reset the photodiode, the resetting unit comprising a transistor,
the drive method comprising
supplying a first potential to the first semiconductor region forming the photodiode when the resetting unit performs a reset operation, and supplying a second potential to the first semiconductor region when the resetting unit is not performing a reset operation.

14. An electronic apparatus comprising an imaging apparatus with logarithmic characteristics, the imaging apparatus including:
- a photodiode configured to receive light;
- a well tap unit configured to fix a potential of a first semiconductor region of the photodiode, the well tap unit comprising an n+ region of the photodiode;
- a charging unit for a second semiconductor region of the photodiode, the charging unit being formed in a position at a distance from the second semiconductor region, wherein a signal line for supplying charge is connected to the charging unit;
- a resetting unit configured to reset the photodiode, the resetting unit comprising a transistor, wherein the second semiconductor region of the photodiode outputs a voltage signal equivalent to a photocurrent subjected to logarithmic compression.

* * * * *